(12) United States Patent
Aoyama et al.

(10) Patent No.: US 6,276,803 B1
(45) Date of Patent: *Aug. 21, 2001

(54) OPTICAL PATH CONVERTING OPTICAL ELEMENT, OPTICAL PATH CONVERTER, AND OPTICAL PROJECTOR AND IMAGE DISPLAY APPARATUS USING SAID OPTICAL ELEMENT

(75) Inventors: Shigeru Aoyama; Masayuki Shinohara; Tsukasa Yamashita; Hiroshi Kitajima, all of Kyoto (JP)

(73) Assignee: Omron Corporation, Kyoto (JP)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 08/856,080

(22) Filed: May 14, 1997

(30) Foreign Application Priority Data

May 14, 1996 (JP) .................................................. 8-144912

(51) Int. Cl.$^7$ .................................................... G03B 21/14
(52) U.S. Cl. ............................................... 353/81; 353/38
(58) Field of Search ...................... 353/38, 81; 349/57, 349/62; 359/625, 640, 833, 837; 362/339, 337

(56) References Cited

U.S. PATENT DOCUMENTS

| 4,477,148 | 10/1984 | Tsuji et al. . | |
|---|---|---|---|
| 4,627,690 | 12/1986 | Fantoine . | |
| 4,871,233 | * 10/1989 | Sheiman | 359/640 |
| 5,016,980 | 5/1991 | Waldron . | |
| 5,035,486 | * 7/1991 | Inokuchi | 359/625 |
| 5,208,620 | * 5/1993 | Misutake et al. | 353/38 |
| 5,537,171 | * 7/1996 | Ogino et al. | 353/38 |
| 5,661,603 | * 8/1997 | Hanano et al. | 359/640 |

FOREIGN PATENT DOCUMENTS

| 0 460 241 | 12/1991 | (EP) . |
| 0 684 423 | 5/1995 | (EP) . |
| WO 98/48312 | 10/1998 | (WO) . |

\* cited by examiner

*Primary Examiner*—William Dowling
(74) *Attorney, Agent, or Firm*—Foley & Lardner

(57) ABSTRACT

A first prism array (34) formed on a prism array plate (32) is arranged so as to confront a second prism array (37) formed on a prism array plate (35). When a light ray (r) that is parallel to an optical axis is transmitted through the first prism array, the light ray r enters into the second prism array (37) while refracted. The light ray that has been refracted by the second prism array (37) becomes an original light ray (r) that is parallel to the optical axis. Therefore, the light ray (r) that has passed through an optical path converting optical element (31) becomes a light ray (r) that is shifted in a direction perpendicular to the optical axis. As a result, the light is split and shuffled by the first prism array (34), so that a luminous intensity distribution thereof is uniformed.

15 Claims, 19 Drawing Sheets

LUMINOUS
INTENSITY

LUMINOUS
INTENSITY

LUMINOUS
INTENSITY

OPTICAL PATH CONVERTING OPTICAL ELEMENT, OPTICAL PATH CONVERTER, AND OPTICAL PROJECTOR AND IMAGE DISPLAY APPARATUS USING SAID OPTICAL ELEMENT

BACKGROUND OF THE INVENTION a) Field of the Invention

The present invention relates to optical path converting optical elements, optical converters, as well as optical projectors and image display apparatuses using such optical elements.

b) Related Art (First example)

A structure of an example of a liquid crystal projector 1 is shown in FIG. 1. This liquid crystal projector 1 employs an integrator lens 5 to provide a uniform luminance distribution. The principle of this luminance distribution adjustment is shown in FIGS. 2(*a*) to 2(*c*).

This liquid crystal projector 1 is constructed as follows. An integrator lens (lens array) 5, a field lens 6, and a condenser lens 7 are arranged ahead of a subsurface illuminator 4 that is constructed of a lamp 2 and a parabolic reflector 3. A liquid crystal display panel 8 is arranged ahead of the condenser lens 7, and a projector lens 10 is arranged ahead of the liquid crystal display panel 8.

Thus, in the liquid crystal projector 1 that is constructed as shown in FIG. 1, light rays r that have been injected rearward from the lamp 2 and reflected by the reflector 3 enter into the integrator lens 5 as substantially parallel rays. As shown in FIG. 2(*b*), a luminous intensity distribution in a direction (X-axis direction) perpendicular to the optical axis of the light rays r before entering into the integrator lens 5 becomes maximum on the optical axis and drastically reduces as the light rays deviates from the optical axis. That is, it is bright in the middle and dark in the periphery. The field lens 6 is arranged slightly ahead of the focal points of the respective lens element regions of the integrator lens 5, and the condenser lens 7 is arranged at the focal point of the field lens 6. As a result, the light rays r that have passed through the respective lens element regions of the integrator lens 5 are condensed by the respective lens element regions of the integrator lens 5, then enter into the field lens 6 as dispersed light rays, and are irradiated onto the entire part of the condenser lens 7 as shown in FIG. 2(*a*). Then, the light rays r that have been collimated by the condenser lens 7 pass through the liquid crystal display panel 8, and an image generated by the liquid crystal display panel 8 is projected onto a screen 11 via the projector lens 10.

Since the light rays r having different luminous intensities which have passed through the different lens element regions of the integrator lens 5 are synthesized by the condenser lens 7 this way, the light rays r having an ununiform luminous intensity distribution are converted into light rays having a uniform luminous intensity distribution by passing through the optical system including the integrator lens 5, the field lens 6, and the condenser lens 7 as shown in FIG. 2(*c*), and thereafter enter into the liquid crystal display panel 8. As a result, the luminance distribution of an image projected onto the screen 11 becomes also uniform.

(Second example)

FIG. 3 shows an example of an image display apparatus 16 which uses a microlens to improve luminance. As shown in FIG. 3, this image display apparatus 16 has a microlens array 17 arranged so as to confront the liquid crystal display panel 8. The liquid crystal display panel 8 is formed by sealing a liquid crystal material 23 between a glass substrate 21 and a glass substrate 22. The glass substrate 21 has a black matrix region 19 having wirings and the like for driving TFTs 18, transparent electrodes 20, and the like formed thereon. The glass substrate 22 has a total surface common electrode formed thereon. The transparent electrode (20) portions surrounded by the black matrix region 19 serves as pixel holes 24. Lenses 25 forming the microlens array 17 are arranged so as to confront the pixel holes 24, respectively.

Thus, if the microlens array 17 is not employed, part of light rays r that have entered into the liquid crystal display panel 8 are shielded by the black matrix region 19 as shown in FIG. 4. Therefore, light utilization efficiency is reduced, which in turn reduces the luminance of the image display apparatus 16. In contrast thereto, if the microlens array 17 is employed, light rays r that have entered into the respective lenses 25 of the microlens array 17 are condensed onto the respective pixel holes 24 of the liquid crystal display panel 8 as shown in FIG. 5. That is, all the light rays having entered into the liquid crystal display panel 8 can be transmitted through the pixel holes 24. As a result, light utilization efficiency can be improved by utilizing the microlens array 17, and the luminance of the image display apparatus 16 can be improved.

In view of the aforementioned examples, it is conceivable to manufacture an image display apparatus 16 having a high luminance distribution as well as a uniform luminance distribution if the microlens array 17 is interposed between the optical system and the liquid crystal display panel 8 such as shown in FIG. 2(*a*).

However, when the optical system constructed of the integrator lens 5, the field lens 6, and the condenser lens 7 is used, the diffusing angle θ of the light that has passed through the condenser lens 7 becomes wide (see FIG. 2(*a*)). Therefore, light rays r such as indicated by broken lines in FIG. 5 are shielded by the black matrix region 19, so that the light rays cannot be condensed onto the pixel holes 24 by the microlens array 17 effectively.

Moreover, if the optical system such as shown in FIG. 2(*a*) is employed, the optical system becomes complicated. Since the field lens 6 must be arranged, the image display apparatus 16 becomes expensive.

SUMMARY OF THE INVENTION

The present invention has been made in view of the aforementioned circumstances. An object of the present invention is therefore to provide an optical element that can make luminous intensity distribution uniform without increasing the light diffusing angle. Another object of the present invention is to propose important applications using such optical element.

An optical path converting optical element is characterized by comprising two prism arrays, each prism array having a plurality of prisms arrayed thereon, both prism arrays being disposed in such a manner that prism arraying directions thereof are substantially parallel to each other.

A mode of embodiment is characterized in that in the optical path converting optical element the two prism arrays are formed on front and back surfaces of a plate.

A mode of embodiment is characterized in that in the optical path converting optical element a shape of a prism array disposed on a light entering side and a refractive index of the plate are set in such a manner that a light ray whose optical path has been converted by the prism array disposed on the light entering side is totally reflected on a side surface of the plate.

A mode of embodiment is characterized in that in the optical path converting optical element one of the prism arrays is constructed of an interface between a first portion having a first refractive index and a second portion having a second refractive index; and the other prism array is constructed of a surface of the second portion.

A mode of embodiment is characterized in that in the optical path converting optical element a shape of a prism array disposed on a light entering side and a refractive index of the second portion are set in such a manner that a light ray whose optical path has been converted by the prism array disposed on the light entering side is totally reflected on a side surface of the second portion.

A mode of embodiment is characterized in that in the optical path converting optical element two plates are included, each plate having one surface thereof being flat and the other surface being formed into the prism array; a flat surface side of one of the plates is arranged so as to confront a prism array side of the other plate; a prism angle of a prism array disposed on a light entering side ranges from 35 to 45°; and a prism angle of a prism array disposed on a light emerging side ranges from 60 to 70°.

A mode of embodiment is characterized in that in the optical path converting optical element the prism arrays are arranged back to back; and prism angles of both prism arrays are set to 60° or more.

A mode of embodiment is characterized in that in the optical path converting optical element a surface of at least one prism array is flattened with a material having a refractive index different from a refractive index of a material of which the prism array is formed.

A mode of embodiment is characterized in that in the optical path converting optical element a light reflecting surface is formed between a first prism array and a second prism array in such a manner that an outer circumference of both prism arrays is enclosed.

A mode of embodiment is characterized in that in the optical path converting optical element a light shifting amount is equal to about ¼ an effective area of an incident luminous flux.

A mode of embodiment is characterized in that in the optical path converting optical element a light shifting amount is equal to about ⅛ an effective area of an incident luminous flux.

An optical path converter is characterized by comprising a plurality of optical path converting optical elements are arranged so as to be arrayed along an optical path.

A mode of embodiment is characterized in that in the optical path converter the optical path converting optical element is arranged on a light entering side; and the optical path converting optical element is arranged on a light emerging side.

A mode of embodiment is characterized in that in the optical path converter prism arraying directions of at least portions of the optical path converting elements are different from each other.

An image display apparatus is characterized by comprising a light source, the optical path converting optical element as recited in claim 1, and an image display panel.

A mode of embodiment is characterized in that in the image display apparatus a projecting optical system for forming an image on the image display penal onto a screen is further arranged.

An optical projector is characterized by comprising a light source and the optical path converting optical element.

Each of the optical path converting optical elements of the present invention has two prism arrays, and the prism arraying directions of both prism arrays are parallel to each other. Thus, when a light ray passes through a prism array on the light entering side, the light ray is refracted by the operation of such prism. The travelling direction of the light ray is changed from that of the light ray before injection by refraction at the prism array. Since the direction of the light ray has been changed, the light ray gradually deviates from the extension of the original light ray travelling direction by the time the light ray enters into the prism array on the light emerging side via the prism array on the light entering side. Thus, if the optical system is designed so that a light ray that has deviated from the extension of the original light ray travelling direction becomes a light ray that is parallel with the original light ray travelling direction after such light ray has passed through the prism array on the light emerging side, the light ray is shifted parallelly by passing through the optical path converting optical element.

If the optical path converting optical element using such prism arrays is employed, light rays having entered into the optical path converting optical element are split by a prism array and then parallelly shifted and shuffled (rearranged) every split region. Therefore, even if a luminous flux has an ununiform luminous intensity distribution before injection, the light rays have the luminous intensity distribution thereof made uniform by passing through the optical path converting optical element.

In addition, light rays that have entered into any region of the optical path converting optical element can be shifted parallel to the original light ray travelling direction. Therefore, there is no likelihood that the light diffusing angle will be increased by the light rays having passed through the optical path converting optical element as in the aforementioned optical system using the integrator lens and the like.

Therefore, according to the optical path converting optical elements of the present invention, luminous intensity distribution and luminance distribution can be uniformed without increasing the light diffusing angle. In addition, unlike the optical system using the integrator lens and the like, a simple configuration can be implemented, which in turn contributes to not only making the thickness of the optical system for providing a uniform luminous intensity distribution thin, but also reducing the cost of manufacture.

Further, if a light reflecting surface is formed so as to enclose the outer circumference of a space between both prism arrays, or if light rays are totally reflected at the outer circumferential surface between both prism arrays, then leakage of light from between the prism arrays can be prevented, which in turn contributes to improving light utilization efficiency and luminance.

If the prism arrays are oriented toward the same direction as recited in claim 6, the prism angle of the prism array disposed on the light entering side is set to 35 to 45°, whereas the prism angle of the prism array disposed on the light emerging side is set to 60 to 70°. As a result, the efficiency of the optical path converting optical element can be improved. Similarly, if the prism arrays are arranged back to back, the prism angles of both prism arrays are set to 60° or more. As a result, the efficiency of the optical path converting optical element can be improved.

Further, in the optical path converters of the present invention, a plurality of optical path converting optical elements of the present invention are arrayed. Therefore, luminous intensity distribution and luminance distribution can be better uniformed. When the prism arraying directions of the respective optical path converting optical elements are made different from each other in particular, luminous intensity distribution and luminance distribution can be uniformed on a two-dimensional basis.

Still further, when the optical path converting optical elements of the present invention are applied to optical projectors and image display apparatuses, not only luminance distribution can be uniformed, but also luminance can be improved.

DETAILED DESCRIPTION OF THE EMBODIMENTS (First mode of embodiment)

Figure 6:
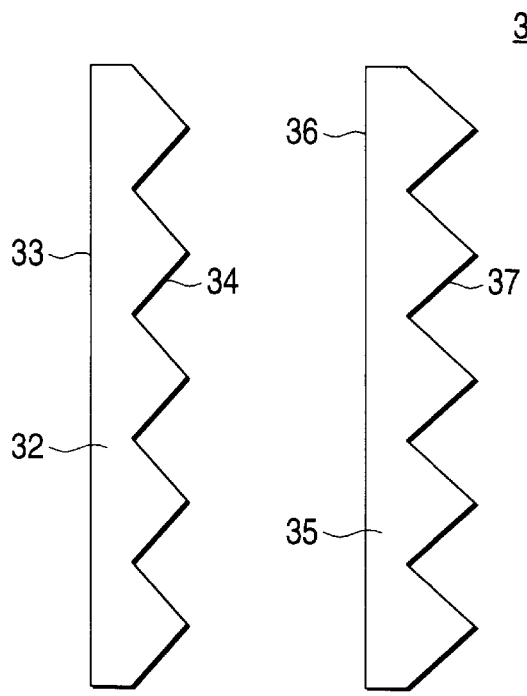
FIG. 6 is a schematic side view showing an optical path converting optical element, which is a mode of embodiment of the present invention.
Figure 7:
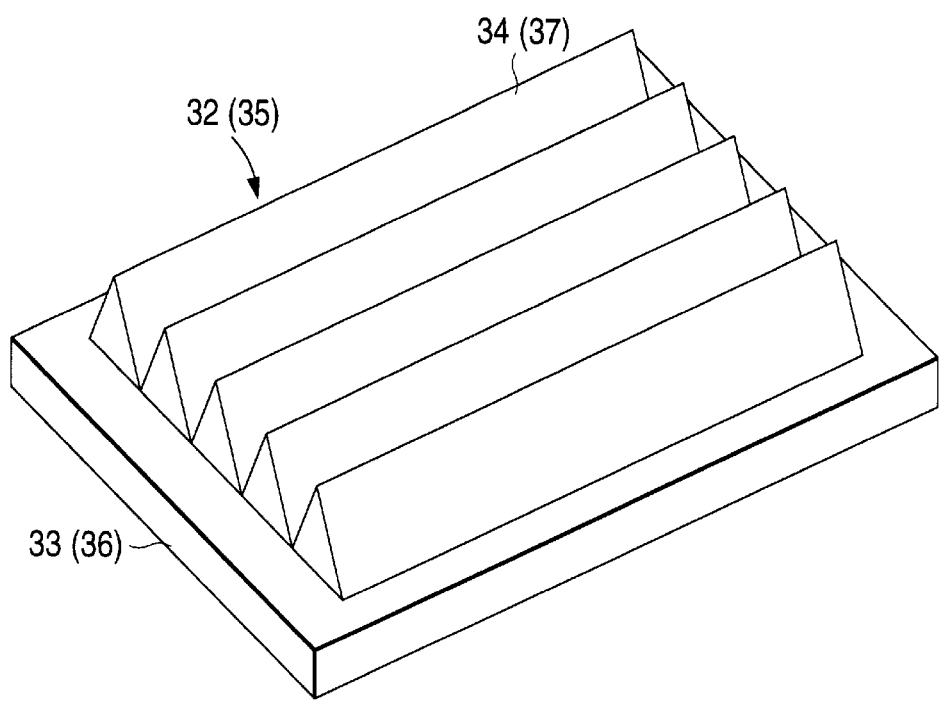
FIG. 7 is a perspective view showing a prism array plate shown in FIG. 6.

FIG. 6 is a schematic side view showing a configuration of an optical path converting optical element 31, which is a mode of embodiment of the present invention. In this mode of embodiment, the optical path converting optical element 31 is formed of two prism array plates 32, 35. As shown in FIG. 7, the prism array plate 32 is formed so that a first flat surface 33 is arranged on one surface thereof and a first prism array 34 having an array of one-dimensional prisms is arranged on the other surface thereof. Similarly, the prism array plate 35 is formed so that a second flat surface 36 is arranged on one surface thereof and a second prism array 37 having an array of one-dimensional prisms is arranged on the other surface thereof. The prism array plate 32 having both the first prism array 34 and the first flat surface 33 is disposed on a light entering side, whereas the prism array plate 35 having both the second prism array 37 and the second flat surface 36 is disposed on a light emerging side. The first prism array 34 arranged on the prism array plate 32 that is disposed on the light entering side confronts the second flat surface 36 arranged on the prism array 35 that is disposed on the light emerging side. The prism array plates 32, 35 are made of glass, transparent resin or a composite body of glass and transparent resin. The prisms formed on the first and second prism arrays 34, 37 are pitched at the same interval and are disposed so that the prism arraying directions are the same in both prism arrays 34, 37. To simply the explanation, the refractive indices n of both prism array plates 32, 35 are set to the same value, but it is not necessarily required that both prism array plates be made of materials having the same refractive index.

Figure 1:
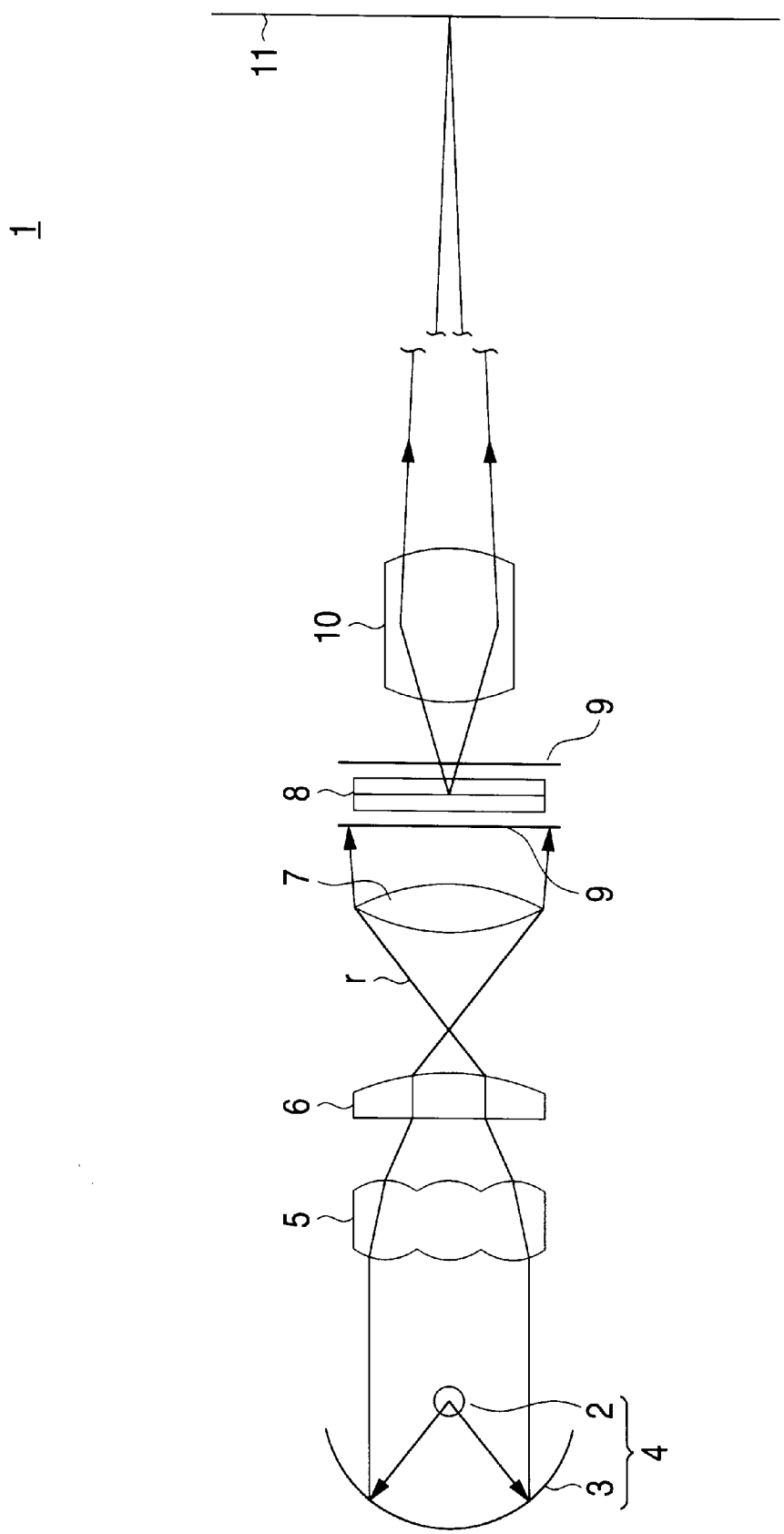
FIG. 1 is a schematic diagram showing a configuration of a liquid crystal projector.
Figure 2:
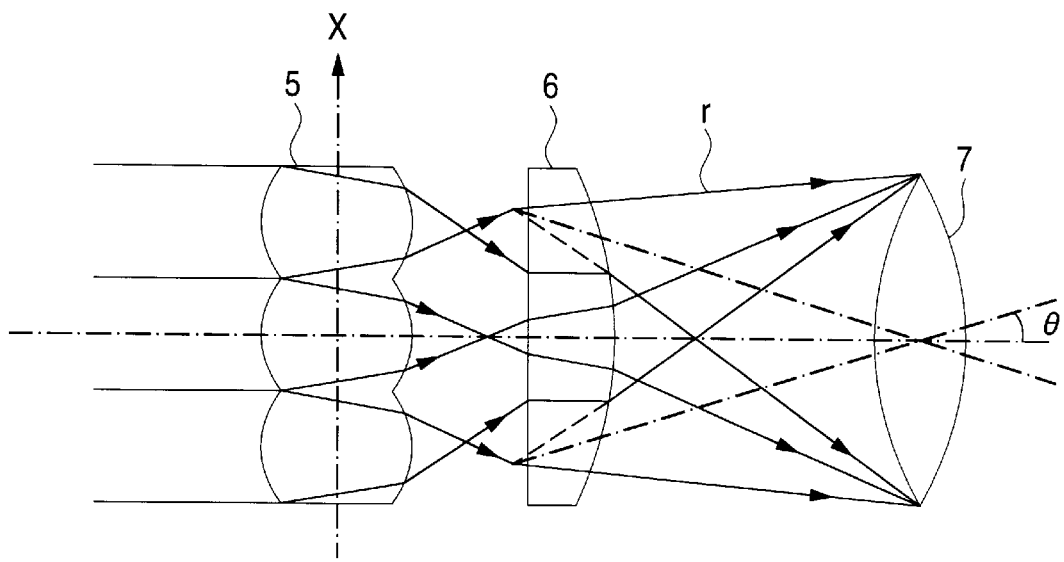
FIG. 2(a) is a diagram illustrative of an operation of an optical system that is interposed between a liquid crystal display panel and a subsurface illuminator in the liquid crystal projector shown in FIG. 1.
FIG. 2(b) is a diagram showing a luminous intensity distribution of light before the light enters into the optical system shown in FIG. 1.
FIG. 2(c) is a diagram showing a luminous intensity distribution of light after the light has passed through the optical system shown in FIG. 1.
Figure 2:
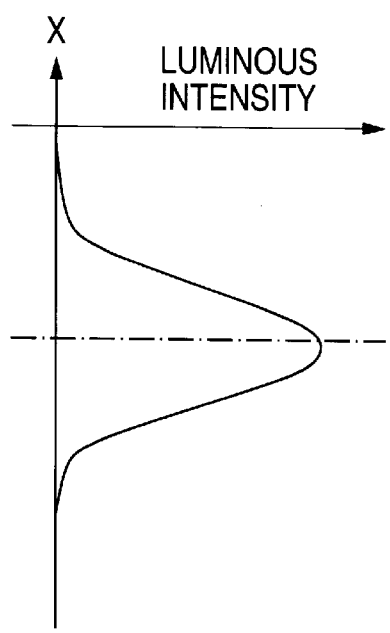
Figure 2:
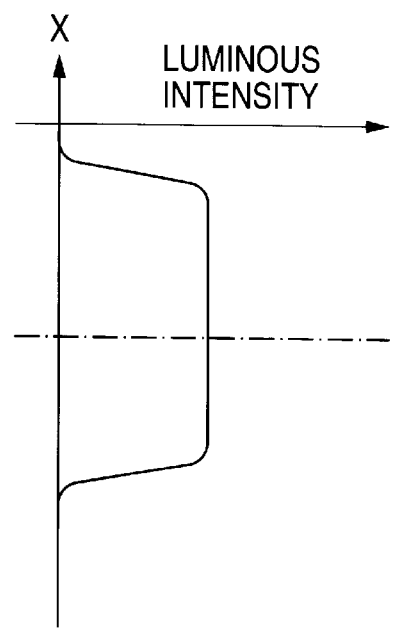
Figure 3:
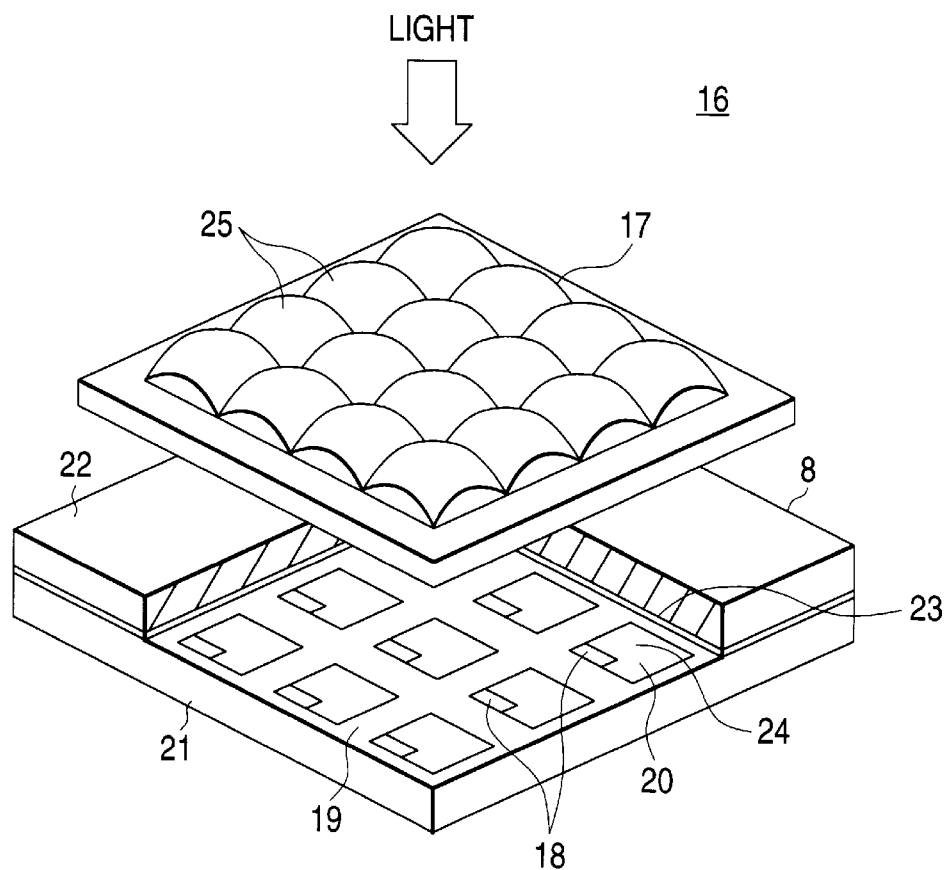
FIG. 3 is a partially cutaway perspective view showing a configuration of a main part of a liquid crystal display apparatus.
Figure 4:
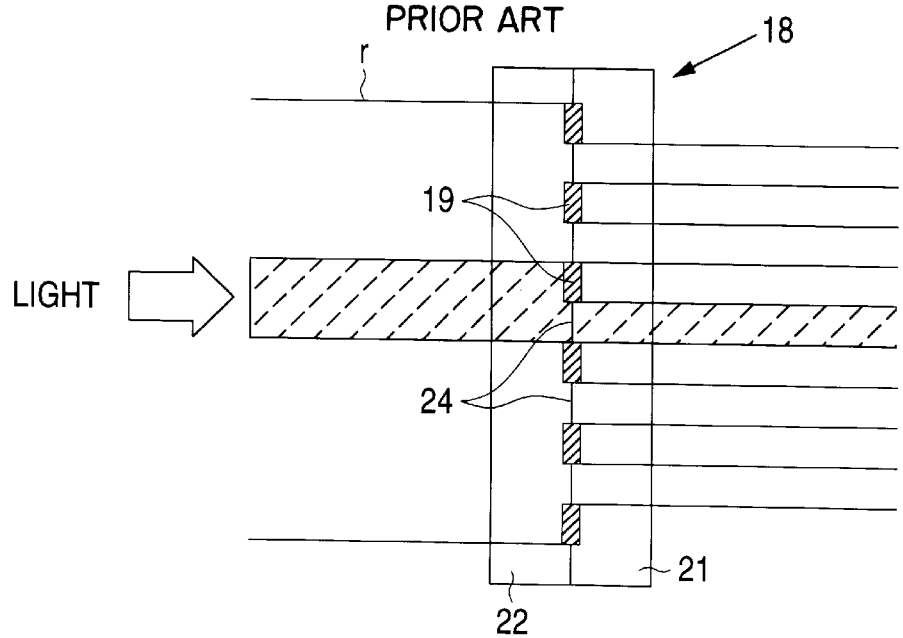
FIG. 4 is a diagram illustrative of a condition in which light rays pass through a liquid crystal display panel when a microlens array is not employed.
Figure 5:
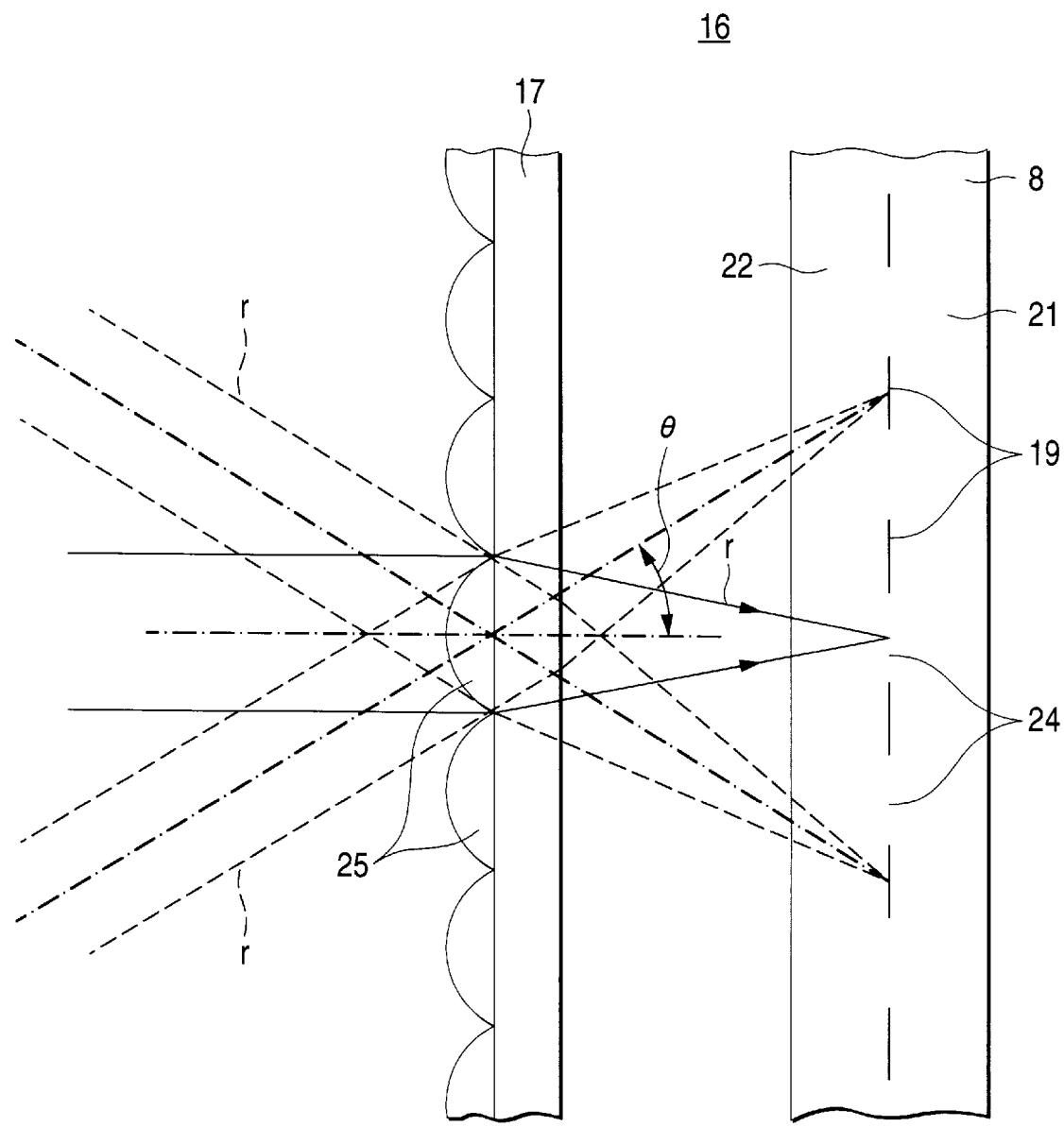
FIG. 5 is a diagram illustrative of a condition in which light rays pass through the liquid crystal display panel when a microlens array is employed.
Figure 8:
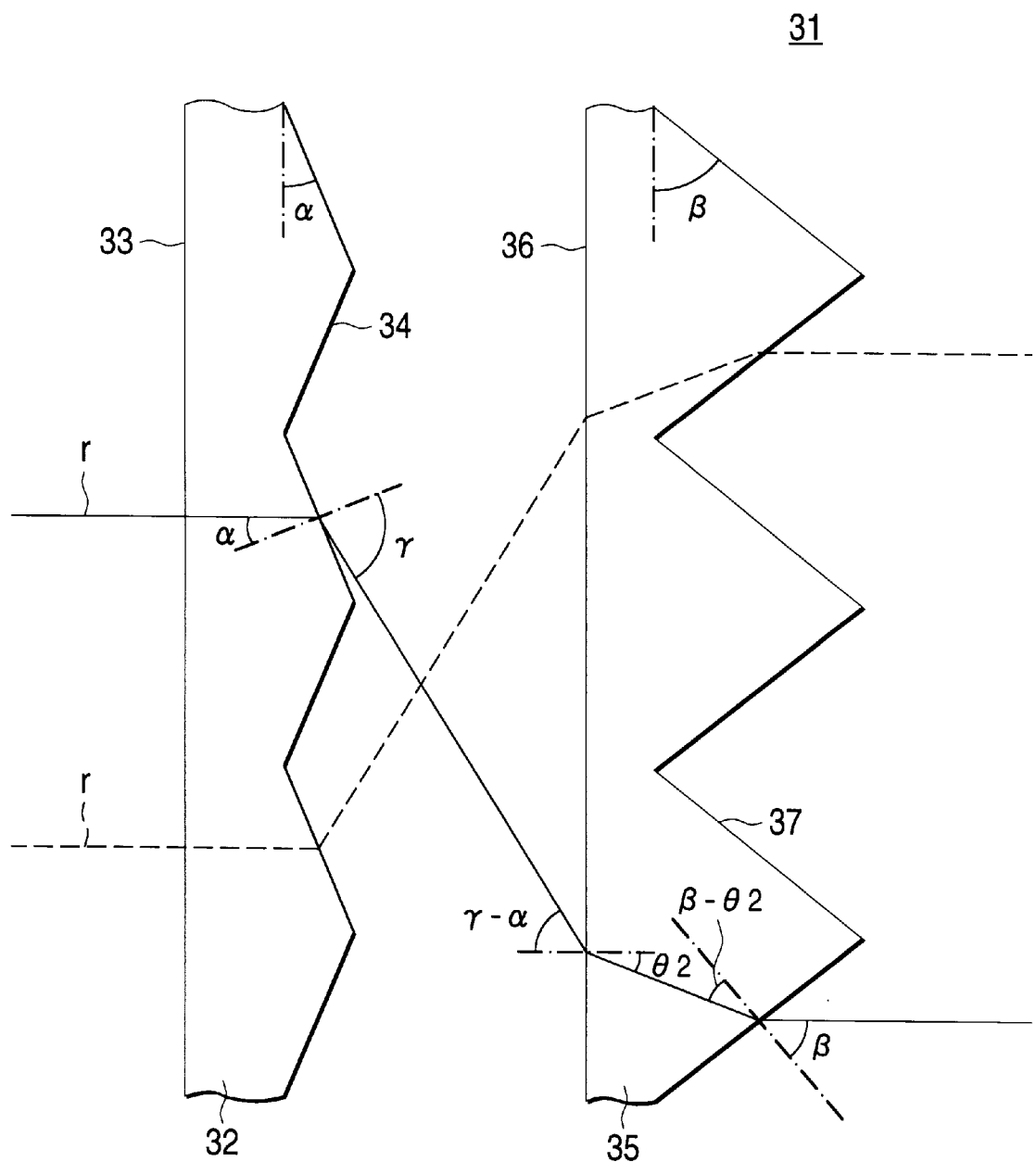
FIG. 8 is a diagram showing light rays for explaining an operation of the optical path converting optical element shown in FIG. 6.

Thus, as shown in FIG. 8, when a light ray r that travels parallel to the optical axis enters into the prism array plate 32 from the first flat surface 33, such light ray r is refracted at the time of emerging from the first prism array 34 and enters into the prism array plate 35 disposed on the light emerging side obliquely from the second flat surface 36. The light ray r that has entered into the prism array plate 35 is not only deflected at the time of obliquely entering into the second flat surface 36, but also deflected at the time of obliquely emerging from the second prism array 37. Here, the first prism array 34 and the second prism array 37 are arranged in such a manner that the direction of inclination of the region in the first prism array 34 through which the light ray r passes is opposite to the direction of inclination of the region in the second prism array 37 through which the light ray r passes. That is, the shapes (prism angles α, β) of the first and second prism array plates 32, 35 are designed so that a light ray that has passed through both prism array plates 32, 35 emerges parallel to the optical axis as the original incident light ray. That is, the light ray r that is parallel to the optical axis has the travelling direction thereof not changed but only parallelly shifted even after the light ray r has passed through the optical path converting optical element 31. As a result, the light diffusing angle becomes very small. Further, as shown in FIG. 8, light rays that have entered parallel to the optical axis are split into respective prism regions by the first prism array 34 and are rearranged in directions perpendicular to the optical path (shuffled) every light ray r passing through the corresponding region while parallelly shifted. Therefore, when light rays r having such ununiform luminous intensity distribution as shown, e.g., in FIG. 2(a) pass through the optical path converting optical element 31, the optical paths thereof are converted in such a manner that the distances from the optical axis are shuffled. As a result, the luminous intensity distribution of such light rays r are uniformed. Therefore, by employing such optical path converting optical element 31, uniform luminous intensity distribution can be provided without increasing light diffusing angles.

(Optical path converting conditions)

In the thus constructed optical path converting optical element 31, conditions for converting optical paths without increasing light diffusing angles are obtained. First, it is necessary that a light ray r having entered into the prism array plate 32 disposed on the light entering side not be totally reflected. This condition is expressed by the following inequality (1).

$$\alpha < \theta c = \sin^{-1}(1/n) \quad (1)$$

where α is the prism angle of the first prism array 34; n (>1) is the refractive index of the prism array plate 32; and θc is the critical angle of total reflection.

Similarly, the condition that the light ray r is not totally reflected by the second prism array 37 of the prism array plate 35 disposed on the light emerging side is expressed in the following inequality (2).

$$\beta - \theta_2 < \theta c = \sin^{-1}(1/n) \quad (2)$$

where β is the prism angle of the second prism array 37; $\theta_2$ is the angle of emergence of light from the second flat surface 36; n is the refractive index of the prism array plate 35; and θc is the critical angle of total reflection.

Then, the condition that the light ray r having emerged from the second prism array 37 travels parallel to the original incident light ray travelling direction can be expressed in the following equations (3) to (5) as can be obtained from the diagram showing the light rays in FIG. 8.

$$\sin\gamma = n \cdot \sin\alpha \quad (3)$$

$$\sin(\gamma - \alpha) = n \cdot \sin\theta_2 \quad (4)$$

$$n \cdot \sin(\beta - \theta_2) = \sin\beta \quad (5)$$

A relational expression between α and β can be obtained by eliminating γ and $\theta_2$ from these equations (3) to (5). Therefore, the desired optical path converting optical element 31 can be obtained by giving a predetermined relation between α and β within such a range as to satisfy inequalities (1) and (2).

Further, in order to maximize the efficiency of the optical path converting optical element 31, it is necessary that a light ray r having emerged from the prism array plate 32 via a single inclined region of the first prism array 34 pass through only one inclined region also in the second prism array 37. That is, if part of the light ray r that has passed through an inclined region of the first prism array 34 passes through a similarly inclined region of the second prism array 37, such light ray r emerges so as to be deviated from the optical axis. As a result, efficiency is reduced. To overcome this problem, an inequality (6) must be satisfied by making the angle $\theta_2$ between the light ray r having entered into the second prism array 37 and the optical axis larger than an angle (90°−β) between the inclined surface of the second prism array 37 and the optical axis.

$$\theta_2 > 90° - \beta \quad (6)$$

Figure 9:
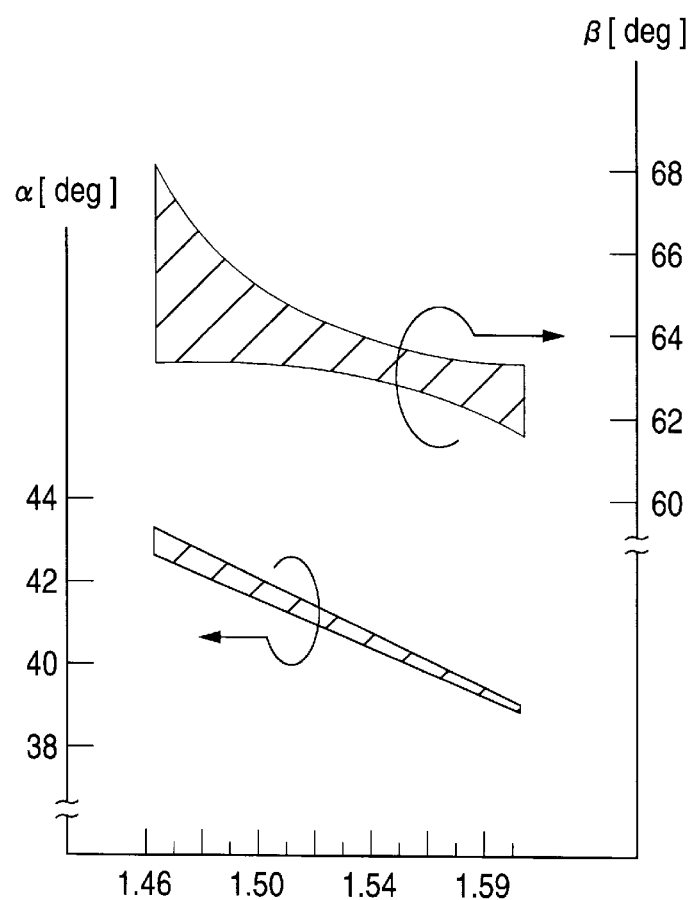
FIG. 9 is a diagram showing an allowable range of prism angles α, β in function of refractive index n.

FIG. 9 shows the range of α, β satisfying the aforementioned inequalities and equations (1) to (6) in function of the refractive index n. As can be understood from FIG. 9, if the refractive index n ranges from 1.46 to 1.59, the prism angle α of the first prism array 34 must be set to values ranging from 35 to 45°. Further, the prism angle β of the second prism array 37 must be set to values ranging from 60 to 70°.

(Second mode of embodiment)

Figure 10:
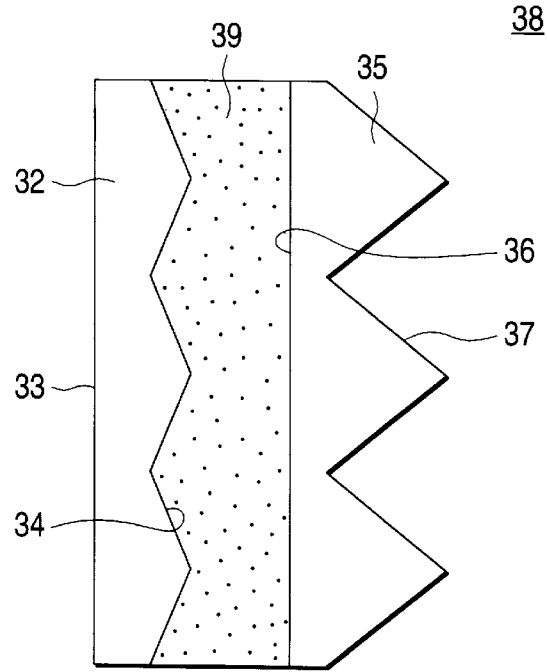
FIG. 10 is a schematic side view showing an optical path converting optical element, which is another mode of embodiment of the present invention.

An optical path converting optical element 38 shown in FIG. 10 is a modification of the first mode of embodiment. This optical path converting optical element 38 is formed by flattening the first prism array 34 arranged on the prism array plate 32 on one side by loading a material 39 such as a transparent resin or a transparent adhesive having a lower refractive index than the refractive index n of the prism array plate 32, and bonding the second flat surface 36 of the prism array 35 on the other side onto the material 39 having the lower refractive index.

(Third mode of embodiment)

Figure 11:
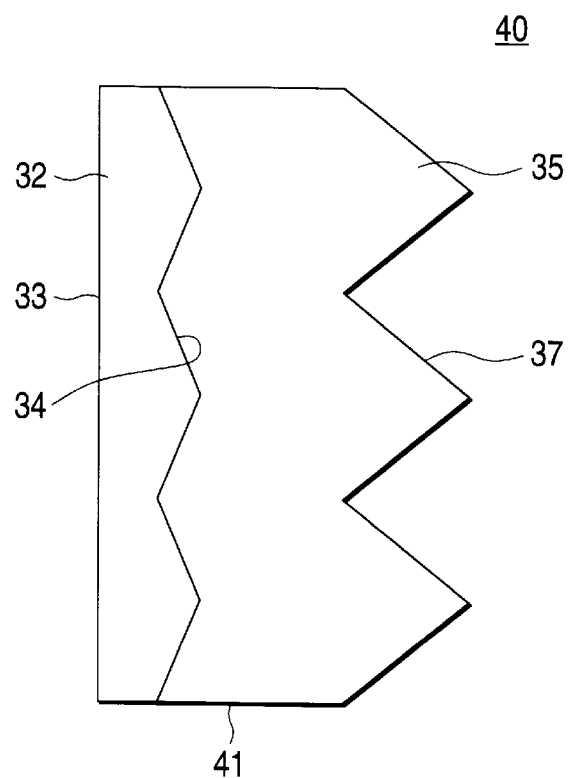
FIG. 11 is a schematic side view showing an optical path converting optical element, which is still another mode of embodiment of the present invention.

An optical path converting optical element 40 shown in FIG. 11 is also a modification of the first mode of embodiment. This optical path converting optical element 40 is formed by molding the prism array plate 35 on the other side directly on the first prism array 34 of the prism array plate 32 on one side. In this optical path converting optical element 40, a light ray having shifted to an outer circumference 41 of the prism array 35 is totally reflected at the outer circumference 41 of the prism array plate 35 and then emerges from the second prism array 37. Therefore, the quantity of light lost can be reduced by improving light utilization efficiency. It may be noted that a reflecting film may be formed on the outer circumference 41 of the prism array plate 35 using an aluminum deposited film, an optical multilayer film, or the like.

(Fourth mode of embodiment)

Figure 12:
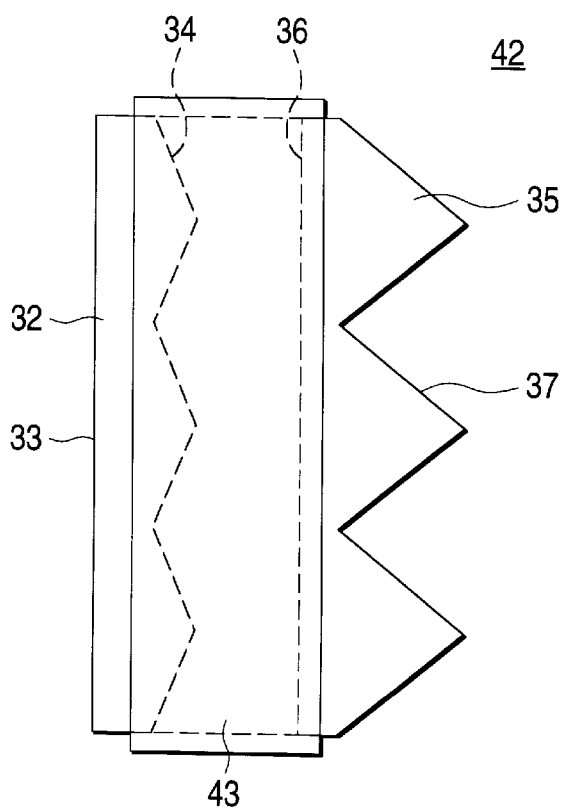
FIG. 12 is a schematic side view showing an optical path converting optical element, which is still another mode of embodiment of the present invention.

An optical path converting optical element 42 shown in FIG. 12 is also a modification of the first mode of embodiment. This optical path converting optical element 42 is formed by arranging the prism array plate 32 so as to confront the prism array plate 35 while interposing a space therebetween, and by arranging a framelike light reflecting plate (inner surface mirror) 43 so as to enclose the space between both prism array plates 32, 35. By arranging the light reflecting plate 43 between the prism array plates 32, 35, a light ray having obliquely emerged from the prism array plate 32 can be reflected by the light reflecting plate 43. As a result, light utilization efficiency can be improved by preventing leakage of light. Further, both prism array plates 32, 35 can be integrated by the light reflecting plate 43.

(Fifth mode of embodiment)

Figure 13:
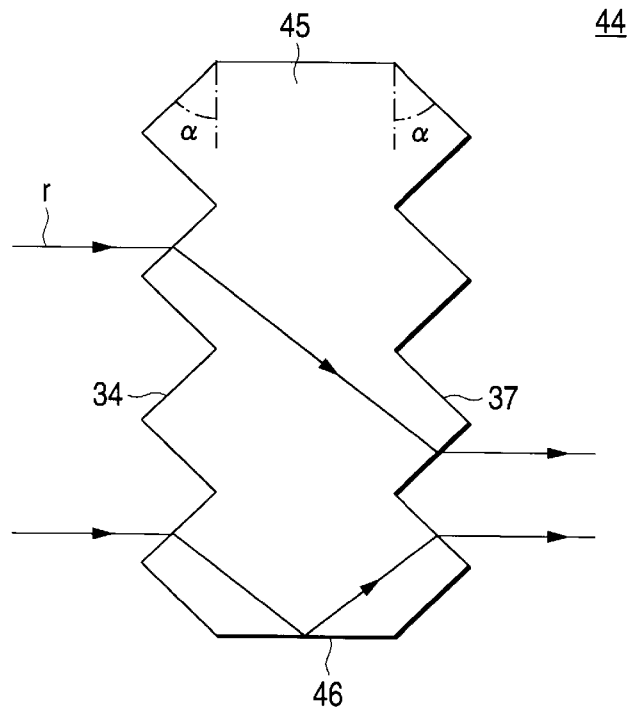
FIG. 13 is a schematic side view showing an optical path converting optical element, which is still another mode of embodiment of the present invention.

FIG. 13 is a schematic side view showing an optical path converting optical element 44, which is still another mode of embodiment of the present invention. This optical path converting optical element 44 has the first and second prism arrays 34, 37 formed on both front and back surfaces of a plate 45 whose refractive index is n. The first and second prism arrays 34, 37 are constructed of prisms that are pitched at the same interval. The prism angles α of both prism arrays 34, 37 are set to 60° or more.

Thus, as shown in FIG. 13, a light ray r having entered into the first prism array 34 parallel to the optical axis enters into the plate 45 while refracted at the first prism array 34, and then emerges from the second prism array 37. Here, if the thickness of the plate 45 and the positions of the first and second prism arrays 34, 37 are defined in such a manner that an inclined region of the first prism array 34 through which the light ray r passes extends parallel to an inclined region of the second prism array 37 through which the light ray r passes, then the light ray r that has entered parallel to the optical axis is shifted in a direction perpendicular to the optical axis and emerges parallel to the optical axis since the prism angles a of the first and second prism arrays 34, 37 are the same. Therefore, this optical path converting optical element 44 also can provide a uniform luminous intensity distribution without increasing the light diffusing angle.

Here, the condition that a light ray refracted at one inclined region of the first prism array 34 enters into an inclined region of the second prism array 37 having the same angle of inclination and emerges parallel to the optical axis can be expressed in the following inequality (7).

$$\theta_2 > 90° - \alpha \qquad (7)$$

where the angle of emergence of the light ray r in the first prism array 34 is $\theta_2$; and the prism angle of the first and second prism arrays is a. Here, the angle or emergence $\theta_2$ is given as $$\theta_2 = \alpha - \sin_{-1}(\sin\alpha/n) \qquad (8)$$

Hence, the aforementioned inequality (7) can be written as $$\alpha - \sin_{-1}(\sin\alpha/n) > 90° - \alpha$$

Figure 14:
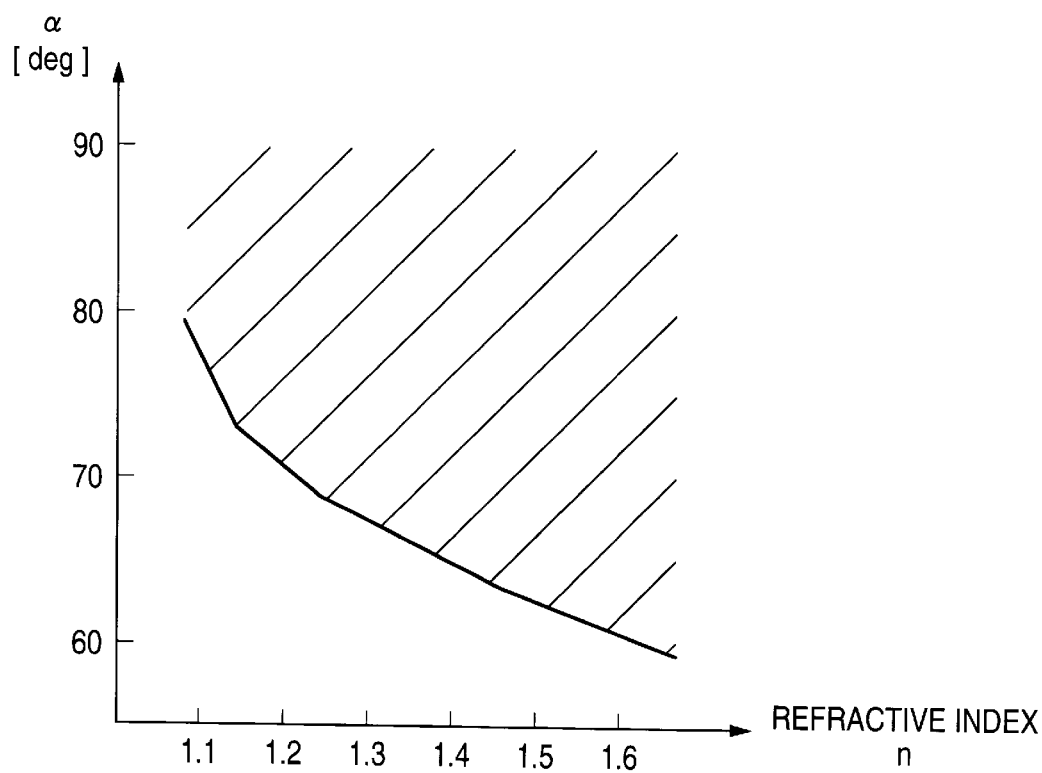
FIG. 14 is a diagram showing an allowable range of prism angle a in function of refractive index n.

FIG. 14 shows the range of the prism angle α in function of the refractive index n. As can be understood from FIG. 14, when the refractive index n is smaller than 1.6, the range of the prism angle α becomes, as described above, 60° or more.

Figure 15:
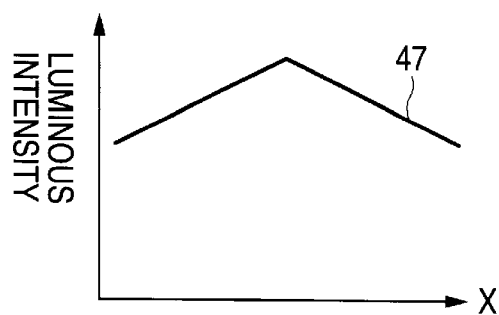
FIGS. 15(a), 15(b), 15(c), 15(d) and 15(e) are diagrams illustrative of a principle of how a luminous intensity distribution is uniformed by the optical path converting optical element shown in FIG. 13.
Figure 15:
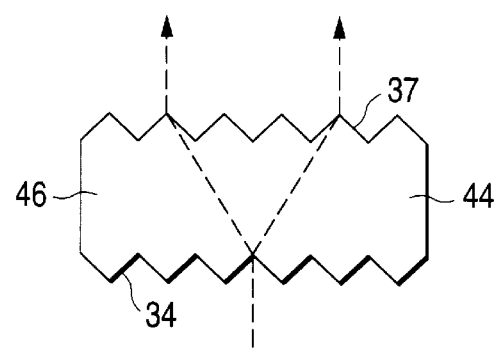
Figure 15:
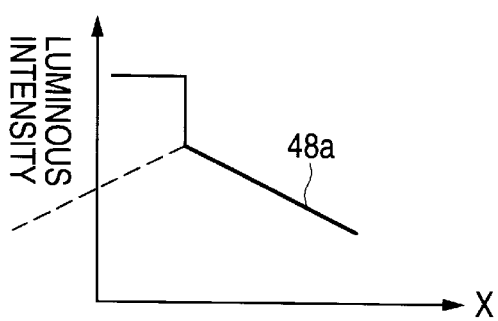
Figure 15:
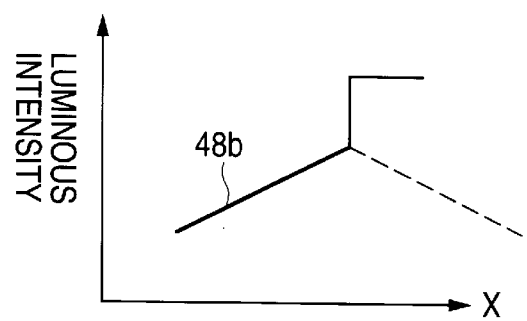
Figure 15:
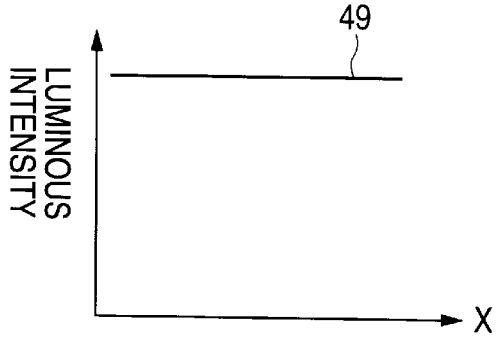

FIGS. 15(a) to 15(e) illustrate a principle of how a luminous intensity distribution is uniformed by the thus constructed optical path converting optical element 44. FIG. 15(a) shows an ununiform luminous intensity distribution of light before the light enters into the optical path converting optical element 44; FIG. 15(b) shows a light ray shifting in an upper left direction and in an upper right direction after having passed through the optical path converting optical element 44; FIGS. 15(c) and (d) show luminous intensity distributions formed respectively by a light ray having shifted leftward and a light ray having shifted rightward; FIG. 15(e) shows a luminous intensity distribution of the light that has passed through the optical path converting optical element, the luminous intensity distribution being formed by synthesizing the luminous intensity distributions shown in FIGS. 15(c) and (d).

How a luminous intensity distribution is uniformed will be described with reference to FIGS. 15(a) to 15(e). When a light ray having a luminous intensity distribution 47 such as shown in FIG. 15(a) is shifted leftward by the optical path converting optical element 44, the luminous intensity distribution 47 shown in FIG. 15(a) seems to be shifted leftward directly. However, the light ray refracted leftward at the left end portion of the first prism array 34 returns rightward while totally reflected at the outer circumference 46 of the optical path converting optical element 44. As a result, a luminous intensity distribution 48a has a portion thereof indicated by the broken line in FIG. 15(c) so turned twice as indicated by the solid line. Similarly, a luminous intensity distribution 48b of the light ray shifted rightward by the optical path converting optical element 44 becomes as shown in FIG. 15(d). Since the light ray shifted leftward and the light ray shifted rightward emerge from the optical path converting optical element 44, the luminous intensity distribution of the light rays emerging from the optical path converting optical element 44 becomes a luminous intensity distribution 49 that is uniform as shown in FIG. 15(e) so as to be formed by synthesizing the luminous intensity distributions shown in FIGS. 15(c) and (d).

(Sixth mode of embodiment)

Figure 16:
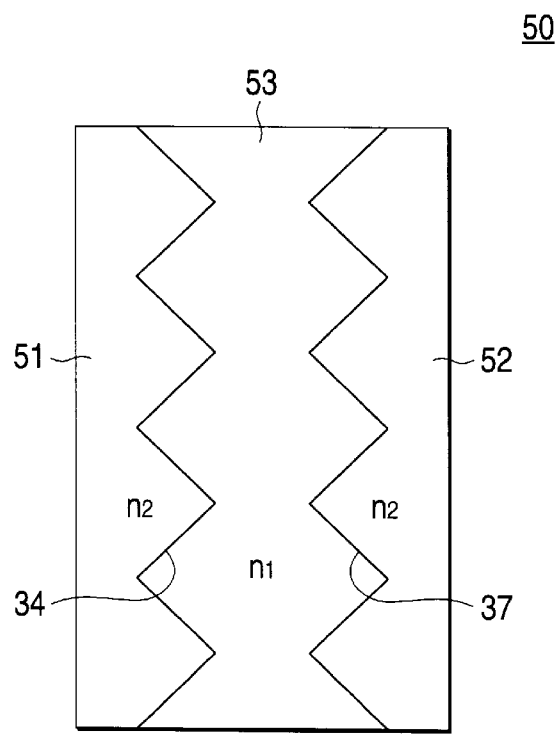
FIG. 16 is a schematic side view showing an optical path converting optical element, which is still another mode of embodiment of the present invention.

An optical path converting optical element 50 shown in FIG. 16 is a modification of the fifth mode of embodiment. This optical path converting optical element 50 is formed by integrally bonding prism array plates 51, 52 with a binder portion 53. The prism array plates 51, 52 have the same refractive index $n_2$ (>1) and the same prism angle a, and are arranged so that the patterned sides thereof confront each other. The binder portion 53 is an ultraviolet curing transparent resin, an ultraviolet curing transparent adhesive, or the like having a refractive index $n_1$ (>$n_2$>1) that is larger than the refractive index $n_2$ of the prism array plates 51, 52. In this optical path converting optical element 50, the first prism array 34 is formed on the interface between the prism array plate 51 on one side and the binder portion 53, and the second prism array 37 is formed on the interface between the binder portion 53 and the prism array plate 52 on the other side.

Also in the optical path converting optical element 50, a light ray that travels parallel to the optical axis emerges as a shifted light ray that travels parallel to the optical axis while travelling along a similar optical path under conditions similar to those in the fifth mode of embodiment.

It can be said that this mode of embodiment is a modification of the fifth mode of embodiment provided by flattening the first prism array and the second prism array arranged on the plate (binder portion) of the fifth mode of embodiment whose refractive index is $n_1$ while loading a transparent material whose refractive index is smaller than the refractive index $n_1$ of the plate.

(Seventh mode of embodiment)

Figure 17:
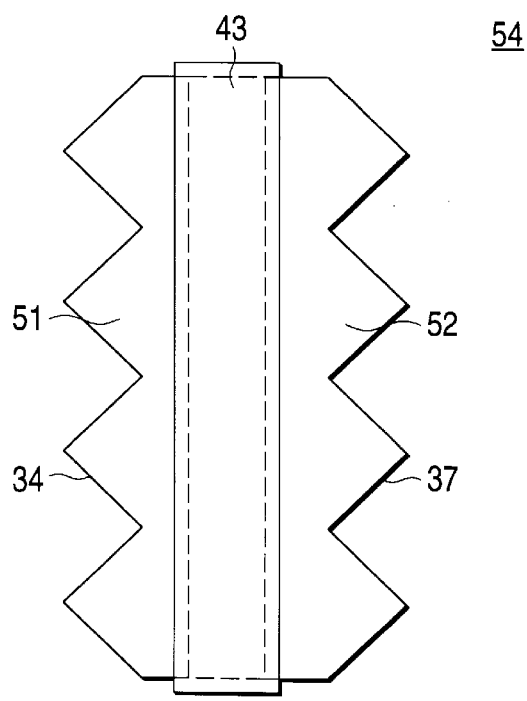
FIG. 17 is a schematic side view showing an optical path converting optical element, which is still another mode of embodiment of the present invention.

An optical path converting optical element 54 shown in FIG. 17 is a mode of embodiment analogous to the fifth mode of embodiment. This mode of embodiment is formed not only by arranging the prism array plate 51 having the first prism array 34 and the prism array plate 52 having the second prism array 37 so that the first and second prism arrays 34, 37 are arranged back to back, but also by enclosing the outer circumference of a space between both prism array plates 51, 52 with a light reflecting plate 43 in a framelike form. This mode of embodiment also allows a light ray to be reflected by the light reflecting plate 43. As a result, leakage of light from the space between the prism array plates 51, 52 can be prevented, which in turn contributes to reducing the quantity of light lost.

(Eighth mode of embodiment)

Figure 18:
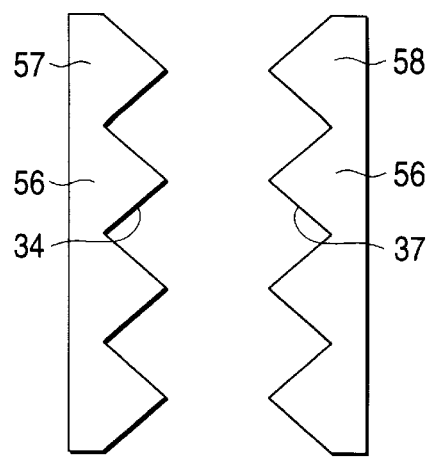
FIG. 18 is a schematic side view showing an optical path converting optical element, which is still another mode of embodiment of the present invention.

FIG. 18 is a schematic side view showing an optical path converting optical element 55, which is still another mode of embodiment of the present invention. This optical path converting optical element 55 is formed by arranging a prism array plate 57 having the first prism array 34 formed on a plate 56 and a prism array plate 58 having the second prism array 37 formed on a plate 56 in such a manner that the first prism array 34 confronts the second prism array 37. Both prism array plates 57, 58 have the same refractive index n (>1) and have the prisms thereof pitched at the same interval.

In the thus constructed optical path converting optical element 55 also, a light ray having entered parallel to the optical axis emerges as a shifted light ray travelling parallel to the optical axis. Therefore, the luminous intensity distribution of such a light ray can be uniformed without increasing the diffusing angle of the light ray.

(Ninth mode of embodiment)

Figure 19:
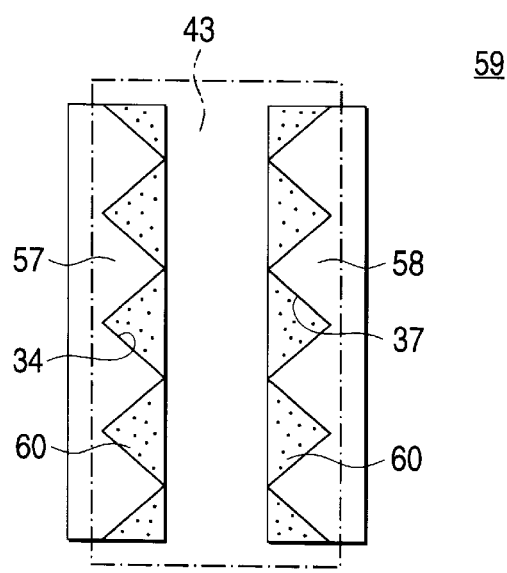
FIG. 19 is a schematic side view showing an optical path converting optical element, which is still another mode of embodiment of the present invention.

An optical path converting optical element 59 shown in FIG. 19 is a modification of the eighth mode of embodiment. This optical path converting optical element 59 is formed by flattening the first prism array 34 formed on the prism array plate 57 while loading a transparent material 60 whose refractive index is smaller than the refractive index n of the prism array plate 57, by flattening the second prism array 37 formed on the prism array plate 58 while loading a transparent material 60 whose refractive index is smaller than the refractive index n of the prism array plate 58, and by enclosing the outer circumference of a space between both prism array plates 57, 58 with the light reflecting plate 43 in a framelike form.

(Tenth mode of embodiment)

Figure 20:
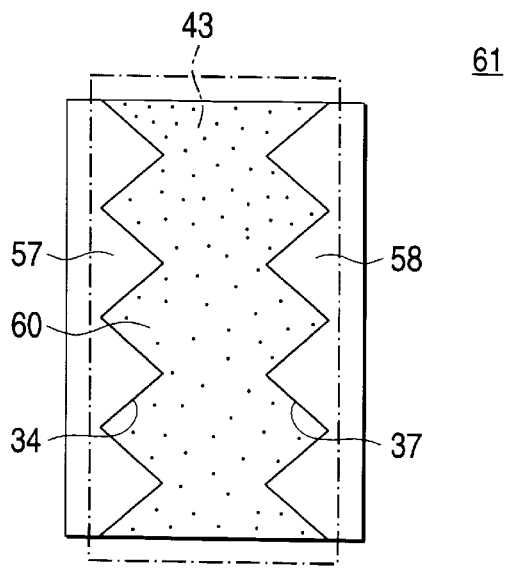
FIG. 20 is a schematic side view showing an optical path converting optical element, which is still another mode of embodiment of the present invention.

An optical path converting optical element 61 shown in FIG. 20 is also a modification of the eighth mode of embodiment. This optical path converting optical element 61 is formed by flattening the prism arrays 34, 37 while loading a transparent material 60 between the first prism array 34 of the prism array plate 57 on one side and the second prism array 37 of the prism array plate 58 on the other side, and by integrating both prism array plates 57, 58 with the transparent material 60. The transparent material 60 has a refractive index $n_2$ that is smaller than the refractive index $n_1$ of the prism array plates 57, 58.

It can also be said that this mode of embodiment is formed by flattening the first prism array 34 and the second prism array 37 formed on both surfaces of a plate having the refractive index $n_2$ while loading a transparent material whose refractive index $n_1$ is larger than the refractive index $n_2$ of the plate.

(Eleventh mode of embodiment)

Figure 21:
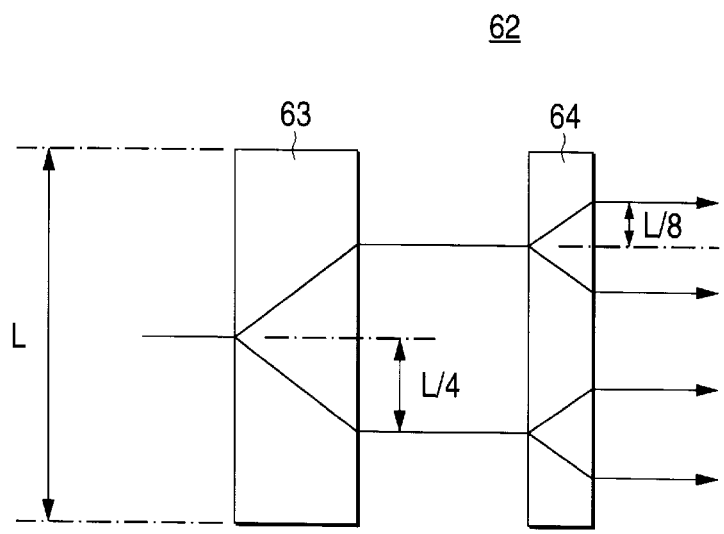
FIG. 21 is a schematic diagram showing an optical path converter, which is still another mode of embodiment of the present invention.

FIG. 21 is a schematic view showing an optical path converter 62, which is still another mode of embodiment of the present invention. This optical path converter 62 has a first optical path converting optical element 63 and a second optical path converting optical element 64 of the present invention arranged along the optical path, and has the prism arraying directions of both optical path converting optical elements 63, 64 disposed so as to be parallel to each other. By using a plurality of optical path converting optical elements 63, 64, if a luminous intensity distribution provided by the first optical path converting optical element 63 is not adequately uniform, a more uniform luminous intensity distribution can be provided by the second optical path converting optical element 64.

Figure 22:
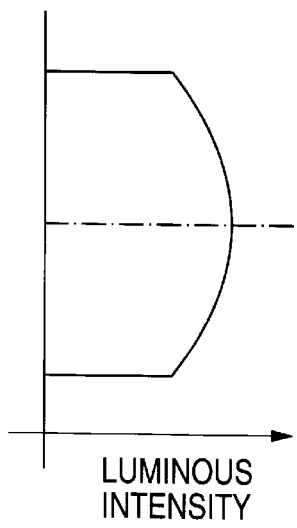
FIGS. 22(a), 22(b) and 22(c) are diagrams illustrative of an operation of the optical path converter shown in FIG. 21.
Figure 22:
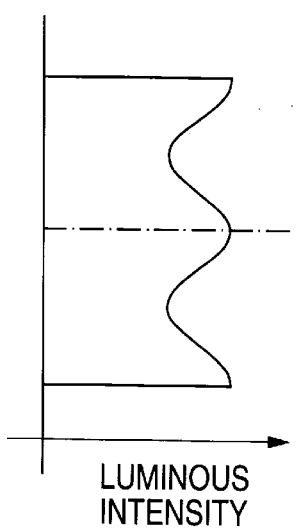
Figure 22:
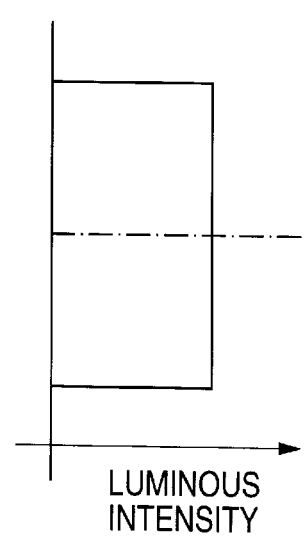

The first optical path converting optical element 63 shifts a light ray by an amount L/4 when it is assumed that the width of an effective area into which a luminous flux enters parallel to the optical axis is L. Similarly, the second optical path converting optical element 64 shifts a light ray by an amount L/8. Thus, for example, as shown in FIG. 22(*a*), a luminous flux having an ununiform luminous intensity distribution enters into the first optical path converting optical element 63, the luminous intensity distribution of such luminous flux has been uniformed by passing through the first optical path converting optical element 63 as shown in FIG. 22(*b*). However, even after having passed through the first optical path converting optical element 63, nonuniformity exhibited at a cycle of L/2 still remains in the thus uniformed luminous intensity distribution. Such nonuniformity exhibited at a cycle of L/2 is rectified by the second optical path converting optical element 64 that is designed so that a light ray is shifted half the shifting amount of the first optical path converting optical element 63. The luminous intensity distribution of the luminous flux that has passed through the second optical path converting optical element 64 becomes as uniform as shown in FIG. 22(*c*).

(Twelfth mode of embodiment)

Figure 23:
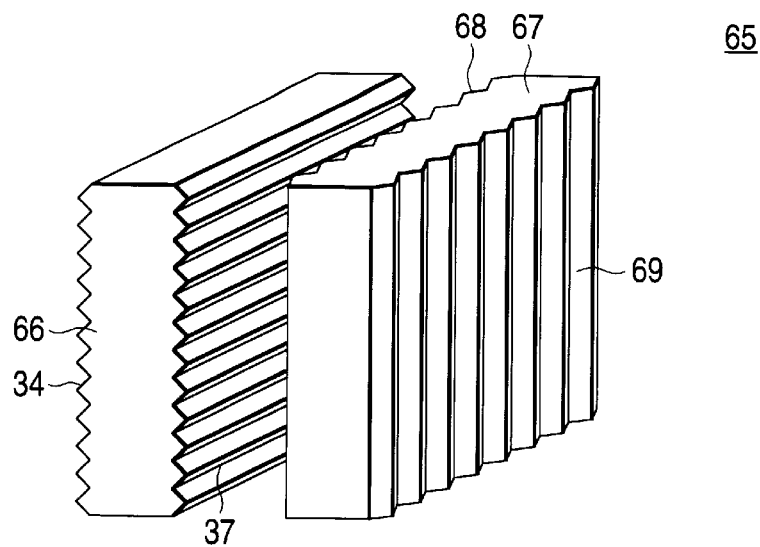
FIG. 23 is a perspective view showing an optical path converter, which is still another mode of embodiment of the present invention.

FIG. 23 is a perspective view showing an optical path converter 65, which is still another mode of embodiment of the present invention. This optical path converter 65 is characterized as making the prism arraying direction of a first optical path converting optical element 66 and that of a second optical path converting optical element 67 different from each other, the first and second optical path converting optical elements 66, 67 being arranged parallel to the optical path. In the mode of embodiment shown in FIG. 23 in particular, both prism arraying directions are set to be orthogonal to each other. That is, the first prism array 34 and the second prism array 37 are formed so that the prism arraying directions thereof are parallel to each other on both surfaces of the first optical path converting optical element 66, whereas a third prism array 68 and a fourth prism array 69 are formed so that the prism arraying directions thereof are parallel to each other on both surfaces of the second optical path converting optical element 67. The first optical path converting optical element 66 and the second optical path converting optical element 67 are disposed so that the prism arraying direction of the first and second prism arrays 34, 37 and that of the third and fourth prism arrays 68, 69 are orthogonal to each other. Further, while there is a space between the first and second optical path converting optical elements 66, 67 in FIG. 23, a transparent adhesive whose refractive index is lower than that of the optical path converting optical elements 66, 67 may be loaded to such space.

Thus, according to the optical path converter 65, a direction in which a light ray is shifted by the first optical path converting optical element 66 is different from a direction in which a light ray is shifted by the second optical path converting optical element 67. Therefore, light rays can be shifted and synthesized on a two-dimensional basis, so that the luminous intensity distribution thereof can be uniformed on a two-dimensional basis.

(Thirteenth mode of embodiment)

Figure 24:
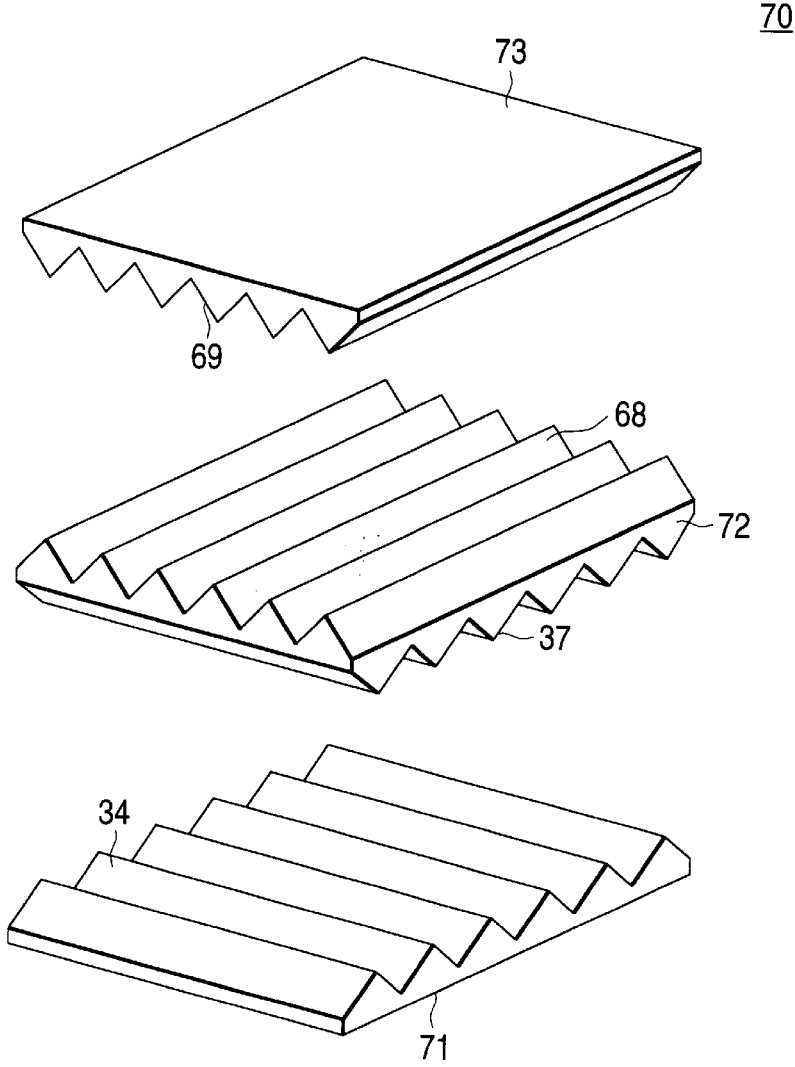
FIG. 24 is a perspective view showing an optical path converter, which is still another mode of embodiment of the present invention.

An optical path converter 70 shown in FIG. 24 is a modification of the twelfth mode of embodiment. The first optical path converting optical element is formed of the first prism array 34 and the second prism array 37 that confront each other so that the prism arraying directions thereof are parallel to each other, whereas the second optical path converting optical element is formed of the third prism array 68 and the fourth prism array 69 that confront each other so that the prism arraying directions thereof are parallel to each other. The prism arraying direction of the first optical path converting optical element and that of the second optical path converting optical element are orthogonal to each other. More specifically, the first prism array 34 of the first optical path converting optical element is arranged on the inner surface of a plate 71 that is on an outer side; the second prism array 37 of the first optical path converting optical element and the third prism array 68 of the second optical path converting optical element are arranged back to back on both surfaces of a plate 72 that is in the middle in such a manner that the prism arraying directions thereof are orthogonal to each other; and the fourth prism array 69 of the second optical path converting optical element is arranged on the inner surface of a plate 73 that is on an outer side. A light reflecting plate (not shown) covers an outer circumference that extends from the plate 71 on the outer side to the plate 73 on the outer side. In the thus constructed optical path converter 70 also, the luminous intensity distribution of a light ray can be uniformed on a two-dimensional basis without increasing the diffusing angle of the light ray.

(Fourteenth mode of embodiment)

Figure 25:
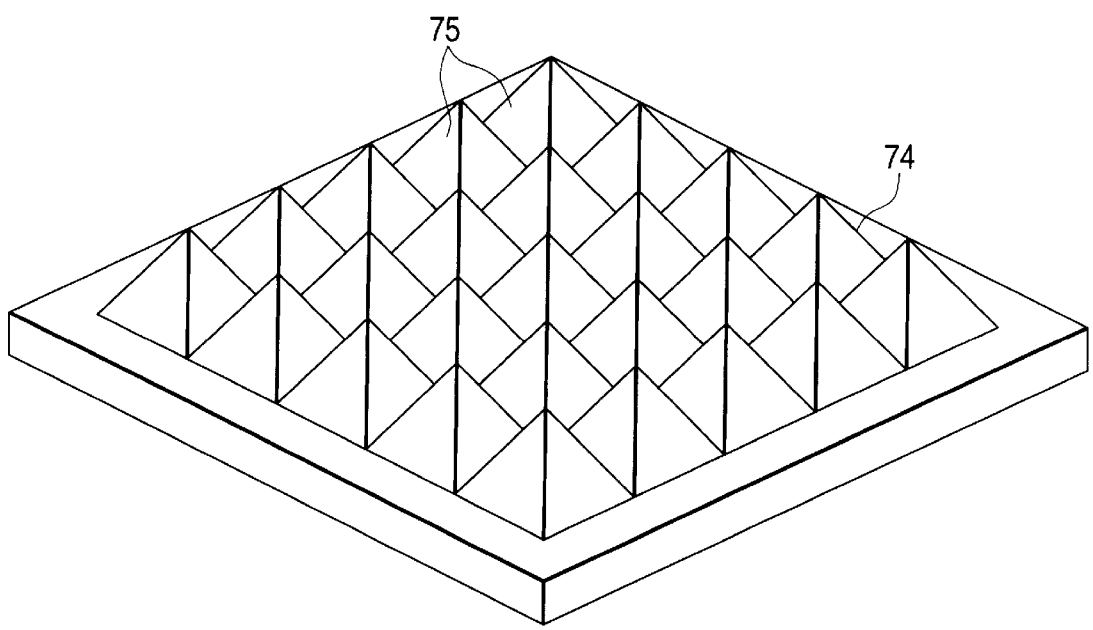
FIG. 25 is a perspective view showing a prism array plate in which prisms are arrayed on a two-dimensional basis.

In order to uniform a luminous intensity distribution on a two-dimensional basis without increasing the diffusing angle of a light ray, an optical path converting optical element having two prism arrays 74 may be employed such as shown in FIG. 25. Each prism array 74 has a great number of prisms 75, each prism having the shape of a pyramid, arranged on two-dimensional basis. While this mode of embodiment exhibits a larger loss of quantity of light than that of the optical path converter according to the thirteenth mode of embodiment, a compact optical path converter can be provided since this converter can be implemented using only one optical path converting element.

(Fifteenth mode of embodiment)

Figure 26:
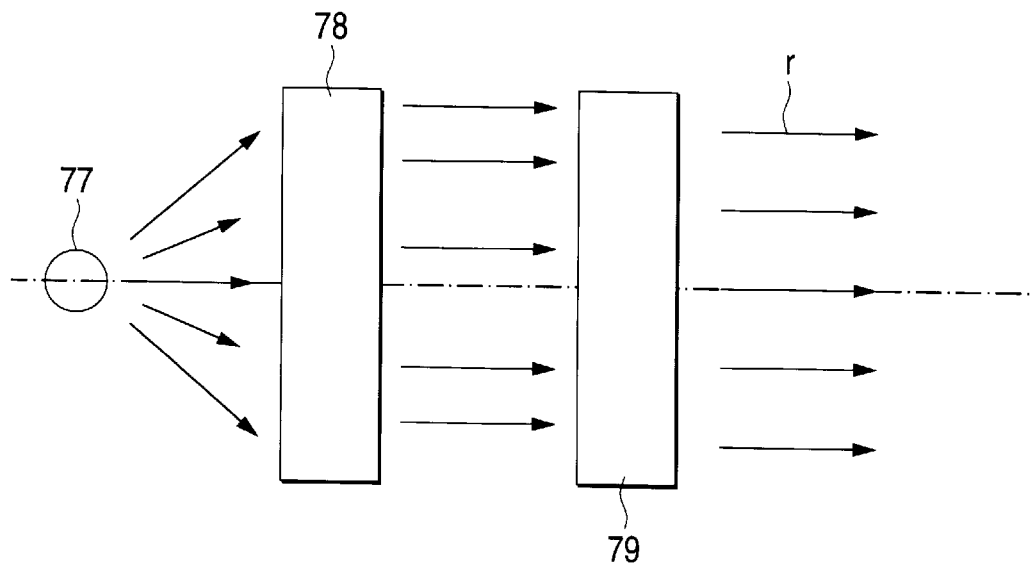
FIG. 26 is a schematic diagram showing a configuration of an optical projector, which is still another mode of embodiment of the present invention.

FIG. 26 is a schematic diagram showing a configuration of an optical projector 76 using an optical path converting optical element of the present invention. This optical projector 76 includes: a point light source 77; a collimating optical element 78 such as a lens; and an optical path converting optical element 79 of the present invention. Light rays injected from the point light source 77 are converted into collimated light rays by the collimating optical element 78; the luminous intensity distribution thereof is uniformed by the optical path converting optical element 79; and the light rays thereafter emerge. Therefore, according to this optical projector 76, collimated light rays having a uniform luminance distribution can be caused to emerge.

(Sixteenth mode of embodiment)

Figure 27:
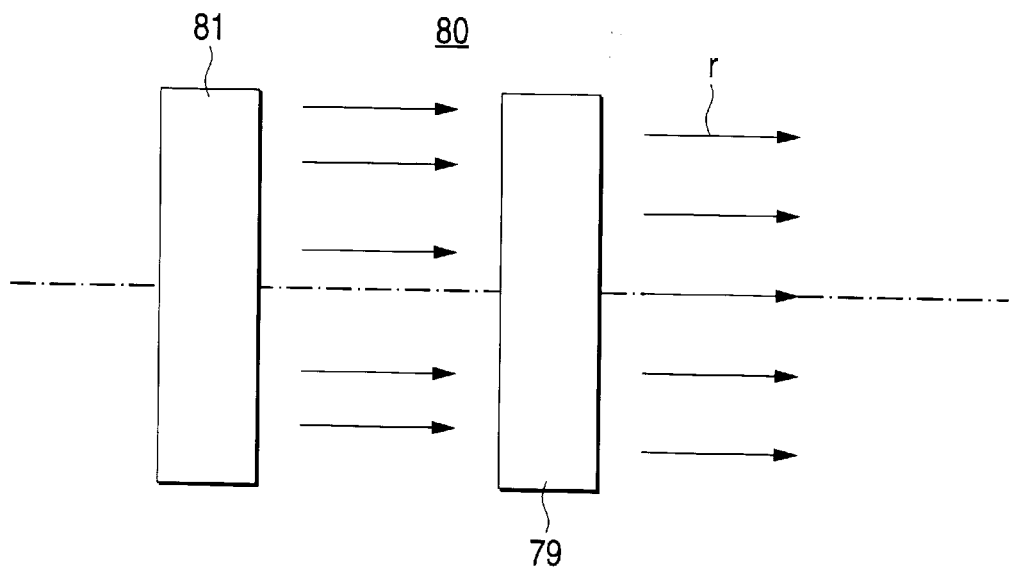
FIG. 27 is a schematic diagram showing a configuration of an optical projector, which is still another mode of embodiment of the present invention.

FIG. 27 is a schematic diagram showing a configuration of another optical projector 80 using an optical path converting optical element of the present invention. This optical projector 80 includes a surface light source 81 and the optical path converting optical element 79 of the present invention. Light rays injected from the surface light source 81 have the luminous intensity distribution thereof uniformed by the optical path converting optical element 79, and the light rays thereafter emerge. Therefore, according to this optical projector 80 also, collimated light rays having a uniform luminance distribution can be caused to emerge.

(Seventeenth mode of embodiment)

Figure 28:
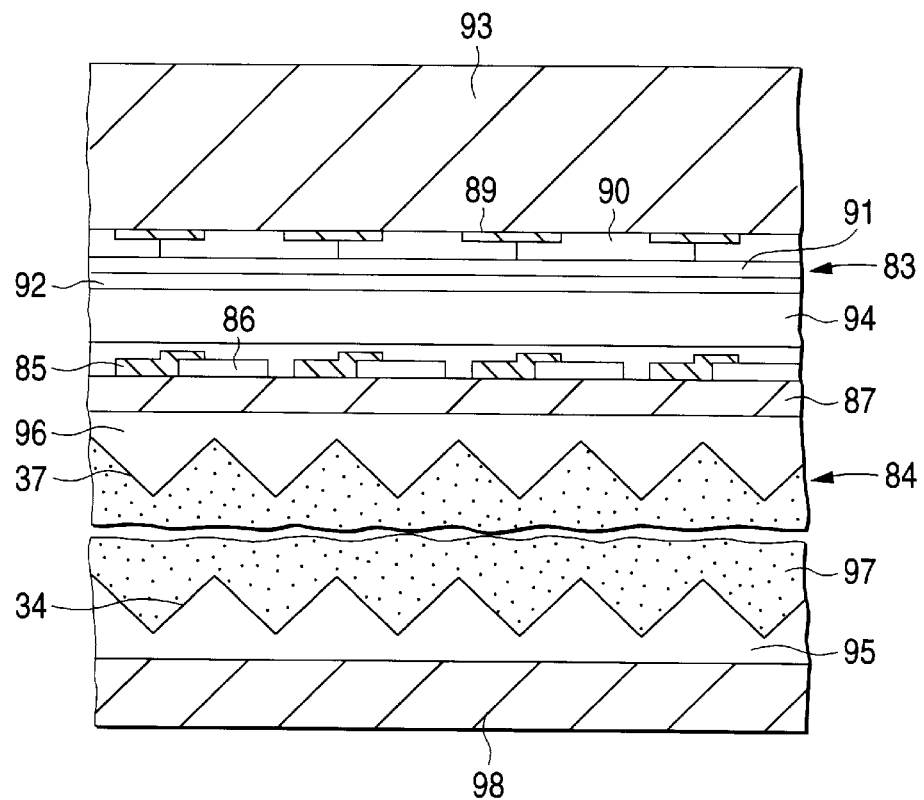
FIG. 28 is a partially cutaway enlarged sectional view showing an image display apparatus, which is still another mode of embodiment of the present invention.

FIG. 28 is a partially cutaway enlarged sectional view showing an image display apparatus 82 using an optical path converting optical element of the present invention. This image display apparatus 82 has a liquid crystal display panel 83 and an optical path converting optical element 84 integrated with each other. The liquid crystal display panel 83 is formed by arranging a glass substrate 87 and a glass substrate 93 so as to confront each other and by sealing a liquid crystal material 94 therebetween. The glass substrate 87 has TFTs 85 and transparent electrodes 86 formed thereon. The glass substrate 93 has a black matrix 89, color filters 90, a total surface common electrode 91, a luminous intensity distribution film 92, and the like formed thereon. The optical path converting optical element 84 is formed by arranging a prism array plate 95 on the light entering side that has the first prism array 34 formed thereon and a prism array plate 95 on the light emerging side that has the second prism array 37 formed thereon so as to confront each other and by integrating both prism array plates 95, 96 while loading a transparent resin 97 between the first prism array 34 and the second prism array 37, the transparent resin 97 having a low refractive index. This optical path converting optical element 84 has the flat surface of the prism array plate 96 on the light emerging side laminated on a surface of the liquid crystal display panel 83, and has a glass substrate 98 laminated on the flat surface of the prism array plate 95 on the light entering side.

Figure 29:
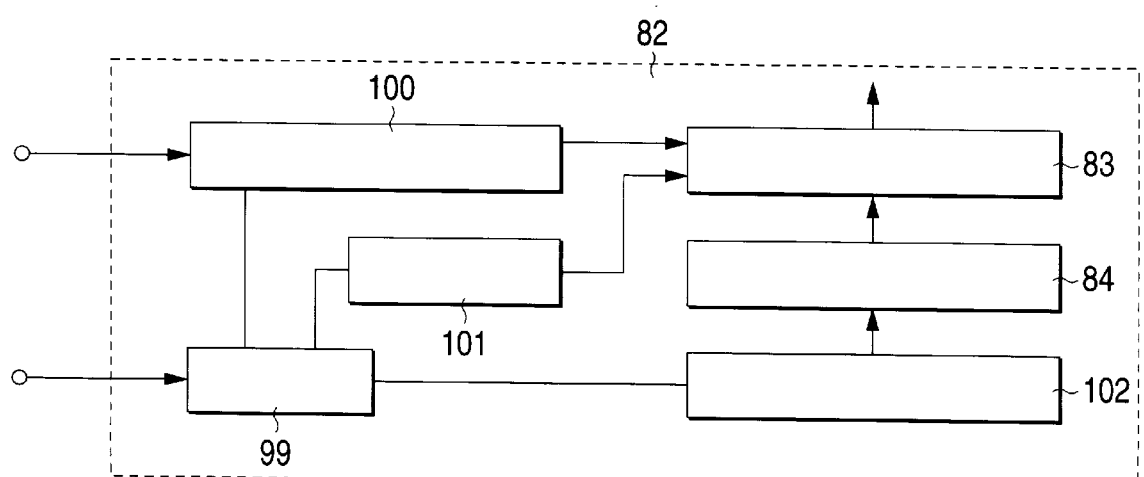
FIG. 29 is a functional block diagram of the image display apparatus shown in FIG. 28.

FIG. 29 is a functional block diagram of the aforementioned image display apparatus 82. A power supply 99 supplies power to an input interface circuit 100, a driver circuit 101, and a surface light source 102. The liquid crystal display panel 83 is driven by the driver circuit 101. When an image signal is sent to the input interface circuit 100, pixels on the liquid crystal display panel 83 are subjected to on/off control, so that image patterns are generated. Further, when the surface light source 102 emits light, light rays injected from the surface light source 102 has the luminous intensity distribution thereof uniformed by the optical path converting optical element 84, and is thereafter irradiated onto the liquid crystal display panel 83, so that an image is formed by light rays that have transmitted through pixels on the liquid crystal display panel 83.

Thus, according to this image display apparatus 82, not only luminance on the screen of the liquid crystal display panel is uniformed by the optical path converting optical element, but also reduction in luminance on the front can be prevented.

(Eighteenth mode of embodiment)

Figure 30:
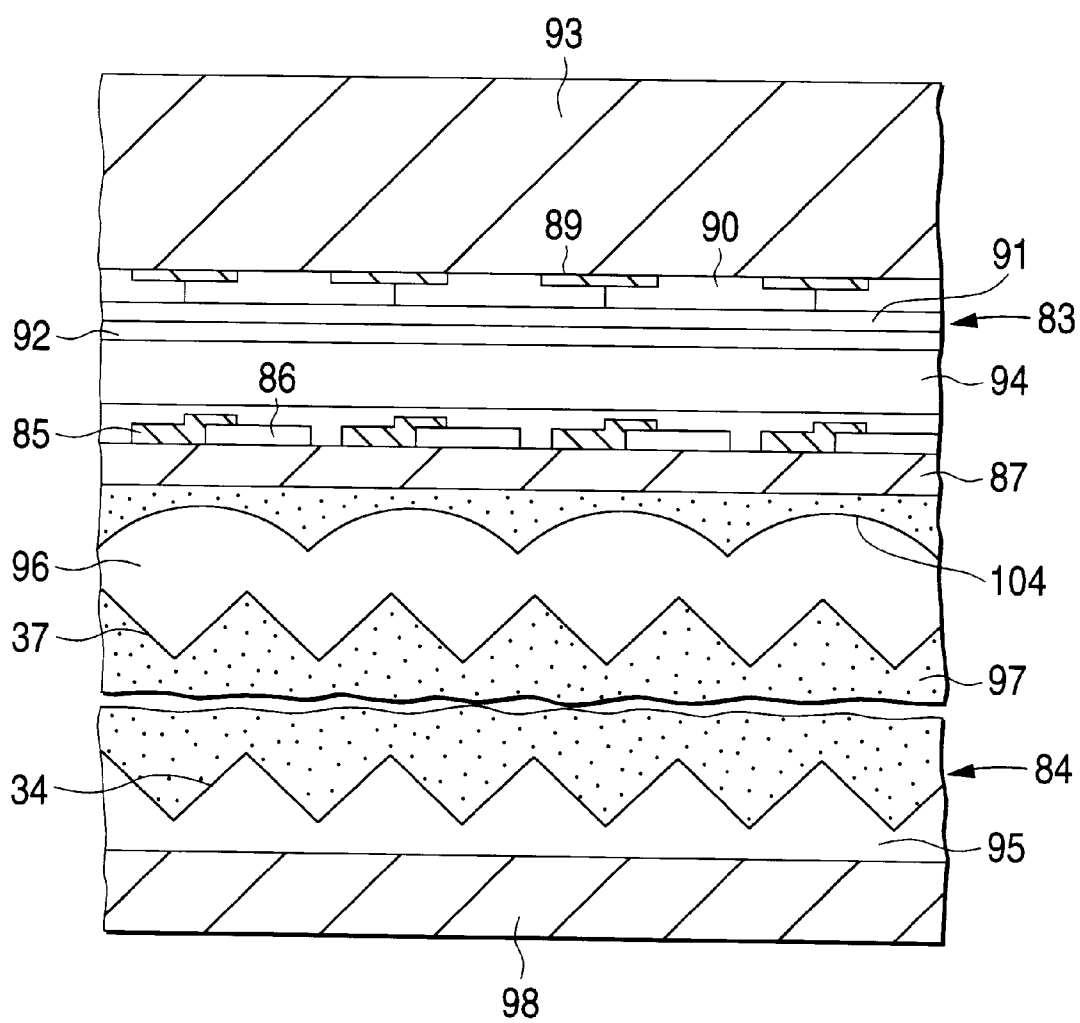
FIG. 30 is a partially cutaway enlarged sectional view showing an image display apparatus, which is still another mode of embodiment of the present invention.

FIG. 30 is a partially cutaway enlarged sectional view showing an image display apparatus 103 using the optical path converting optical element 84 of the present invention. This image display apparatus 103 is characterized as forming a microlens array 104 on a surface of the optical path converting optical element 84 confronting the liquid crystal display panel 83, the optical path converting optical element 84 being laminated on the liquid crystal display panel 83. Thus, light rays injected into the optical path converting optical element 84 from a surface light source have the luminous intensity distribution thereof uniformed by the optical path converting optical element 84, and are thereafter condensed onto pixel holes of the liquid crystal display panel 83 by the microlens 104, and pass through the pixel holes and emerge toward the front of the liquid crystal display panel 83.

Therefore, according to this mode of embodiment, light utilization efficiency can be improved, which in turn allows an image display apparatus with high luminance and uniform luminance distribution to be manufactured.

(Nineteenth mode of embodiment)

Figure 31:
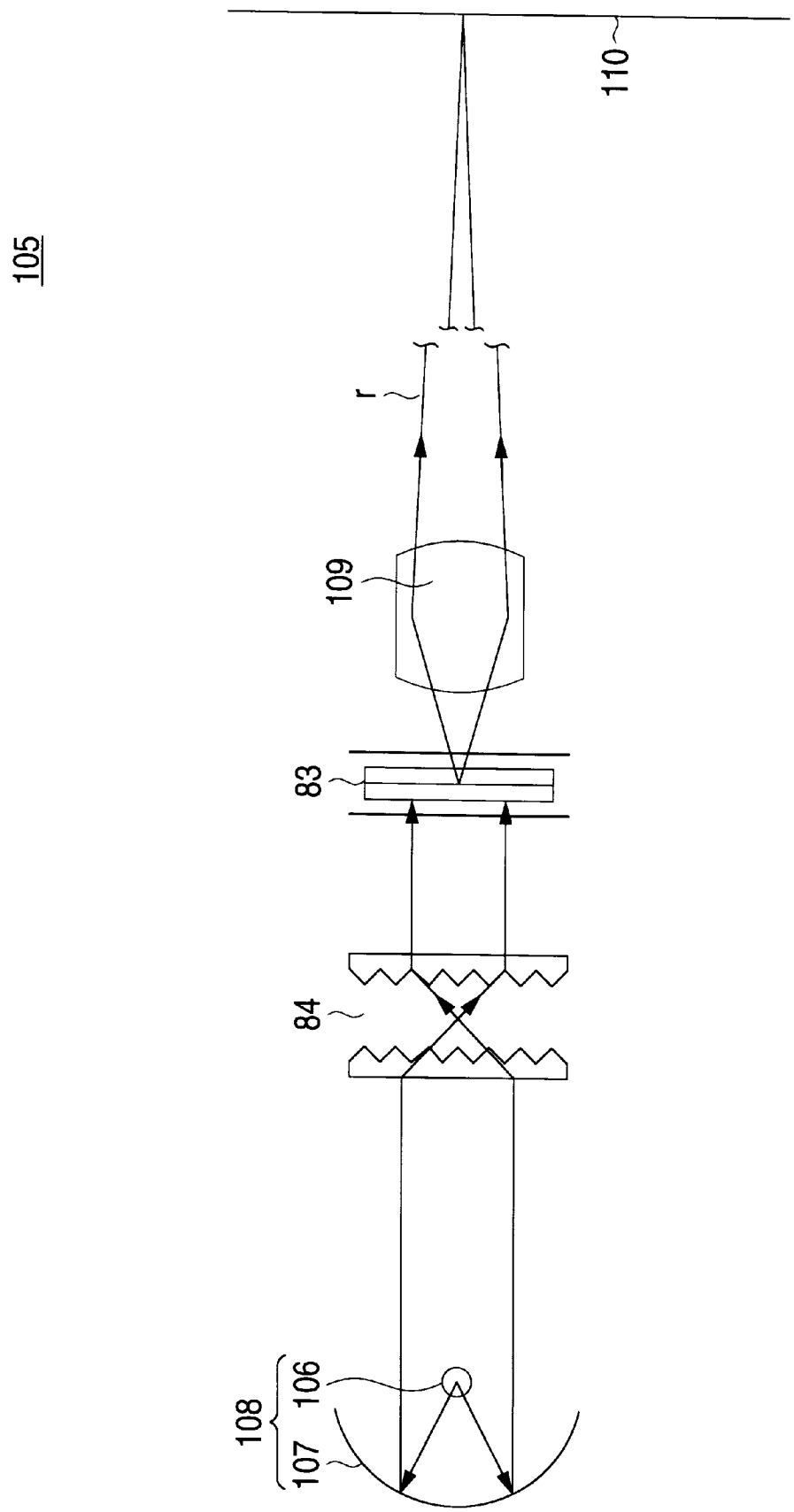
FIG. 31 is a schematic diagram showing a configuration of a liquid crystal projector, which is still another mode of embodiment of the present invention.

FIG. 31 is a schematic diagram showing a configuration of a liquid crystal projector 105 using the optical path converting optical element 84 of the present invention. This liquid crystal projector 105 is characterized as arranging the optical path converting optical element 84 (or an optical path converter) and the microlens array 104 ahead of a subsurface illuminator 108 consisting of a lamp 106 and a parabolic reflector 107, arranging the liquid crystal display panel 83 ahead of the optical path converting optical element 84 and the microlens array 104, and arranging a projector lens 109 ahead of the liquid crystal display panel 83.

Thus, light rays r that have been injected rearward from the lamp 106 and reflected by the reflector 107 are projected onto the optical path converting optical element 84 as substantially parallel light rays, have the luminous intensity distribution thereof uniformed by the optical path converting optical element 84, and are thereafter condensed onto the pixel holes of the liquid crystal display panel 83 by the microlens array 104. The light rays that have passed through the liquid crystal display panel 83 generate an image on a screen 110 through the projector lens 109.

The thus constructed liquid crystal projector 105 can provide uniform and bright images. In addition, unlike the conventional liquid crystal projector, a complicated optical system including an integrator lens, a field lens, and a condenser lens can be dispensed with, which in turn contributes to reducing the cost of manufacture.

(Advantage of the Invention)

As described above, an optical path converting optical element of the present invention allows a luminous flux to be split and the respective split light rays to be shuffled. Therefore, a luminous intensity distribution can be uniformed without increasing the light diffusing angle. In addition, an optical path converter of the present invention are formed of a plurality of optical path converting optical elements. Therefore, a luminous intensity distribution can be better uniformed, and in addition, a luminous intensity distribution can be uniformed on a two-dimensional basis. Therefore, when the optical path converter of the present invention is applied to image display apparatuses or the like, uniform images whose luminance distributions are uniformed can be provided.

What is claimed is:

1. An image display apparatus comprising a light source, an optical path converting optical element comprising two prism arrays, each prism array having a plurality of prisms arrayed in a prism arraying direction, both prism arrays being disposed in such a manner that the prism arraying directions of the prism arrays are substantially parallel to each other, wherein a surface of at least one prism array is flattened with a material having a refractive index different from a refractive index of a material of which the prism array is formed, and an image display panel.

2. An image display apparatus according to claim 1, further comprising a projecting optical system for forming an image on the image display penal onto a screen.

3. An optical path converting optical element comprising two prism arrays, each prism array having a plurality of prisms arrayed in a prism arraying direction, both prism arrays being disposed in such a manner that the prism arraying directions of the prism arrays are substantially parallel to each other, wherein the two prism arrays are formed respectively on front and back surfaces of a plate, and wherein a shape of a prism array disposed on a light entering side and a refractive index of the plate are set in such a manner that a light ray whose optical path has been converted by the prism array disposed on the light entering side is totally reflected on a side surface of the plate.

4. An optical path converting optical element comprising two prism arrays, each prism array having a plurality of prisms arrayed in a prism arraying direction, both prism arrays being disposed in such a manner that the prism arraying directions of the prism arrays are substantially parallel to each other, wherein one of the prism arrays is constructed of an interface between a first portion having a first refractive index and a second portion having a second refractive index; and the other prism array is constructed of a surface of the second portion.

5. An optical path converting optical element according to claim 4, wherein a shape of a prism array disposed on a light entering side and a refractive index of second portion are set in such a manner that a light ray whose optical path has been converted by the prism array disposed on the light entering side is totally reflected on a side surface of the second portion.

6. An optical path converting optical element comprising two prism arrays, each prism array having a plurality of prisms arrayed in a prism arraying direction, both prism arrays being disposed in such a manner that the prism arraying directions of the prism arrays are substantially parallel to each other, and two plates, each plate having one surface thereof being flat and the other surface being formed into the prism array, a flat surface side of one of the plates being arranged so as to confront a prism array side of the other plate, a prism angle of a prism array disposed on a light entering side ranging from 35 to 45°, a prism angle of a prism array disposed on a light emerging side ranging from 60 to 70°.

7. An optical projector comprising a light source and an optical path converting optical element comprising two prism arrays, each prism array having a plurality of prisms arrayed in a prism arraying direction, both prism arrays being disposed in such a manner that the prism arraying directions of the prism arrays are substantially parallel to each other, wherein a surface of at least one prism array is flattened with a material having a refractive index different from a refractive index of a material of which the prism array is formed.

8. An optical path converting optical element comprising two prism arrays, each prism array having a plurality of prisms arrayed in a prism arraying direction, both prism arrays being disposed in such a manner that the prism arraying directions of the prism arrays are substantially parallel to each other, wherein a surface of at least one prism array is flattened with a material having a refractive index different from a refractive index of a material of which the prism array is formed.

9. An optical path converting optical element comprising two prism arrays, each prism array having a plurality of prisms arrayed in a prism arraying direction, both prism arrays being disposed in such a manner that the prism arraying directions of the prism arrays are substantially parallel to each other, wherein a light reflecting surface is formed between a first prism array and a second prism array in such a manner that an outer circumference of both prism arrays is enclosed.

10. An optical path converting optical element comprising two prism arrays, each prism array having a plurality of prisms arrayed in a prism arraying direction, both prism arrays being disposed in such a manner that the prism arraying directions of the prism arrays are substantially parallel to each other, wherein a light shifting amount is equal to about ¼ an effective area of an incident light flux.

11. An optical path converting optical element comprising two prism arrays, each prism array having a plurality of prisms arrayed in a prism arraying direction, both prism arrays being disposed in such a manner that the prism arraying directions of the prism arrays are substantially parallel to each other, wherein a light shifting amount is equal to about ⅛ an effective area of an incident luminous flux.

12. An optical projector comprising a light source and an optical path converting optical element comprising two prism arrays, each prism array having a plurality of prisms arrayed in a prism arraying direction, both prism arrays being disposed in such a manner that the prism arraying directions of the prism arrays are substantially parallel to each other, wherein the two prism arrays are formed respectively on front and back surfaces of a plate, and wherein a shape of a prism array disposed on a light entering side and a refractive index of the plate are set in such a manner that a light ray whose optical path has been converted by the prism array disposed on the light entering side is totally reflected on a side surface of the plate.

13. An optical path converter, comprising:

a first optical path converting optical element comprising two prism arrays, each prism array having a plurality of prisms arrayed in a prism arraying direction, both prism arrays being disposed in such a manner that the prism arraying directions of the prism arrays are substantially parallel to each other, wherein a surface of at least one prism array is flattened with a material having a refractive index different from a refractive index of a material of which the prism array is formed, said first optical path converting optical element arranged on a light entering side; and a second optical path converting optical element comprising two prism arrays, each prism array having a plurality of prisms arrayed in a prism arraying direction, both prism arrays being disposed in such a manner that the prism arraying directions of the prism arrays are substantially parallel to each other, wherein a light reflecting surface is formed between a first prism array and a second prism array in such a manner that an outer circumference of both prism arrays is enclosed, said second optical path converting optical element arranged on a light emerging side.

14. An image display apparatus comprising a light source, an optical path converting optical element comprising two prism arrays, each prism array having a plurality of prisms arrayed in a prism arraying direction, both prism arrays being disposed in such a manner that the prism arraying directions of the prism arrays are substantially parallel to each other, wherein the two prism arrays are formed respectively on front and back surfaces of a plate, and wherein a shape of a prism array disposed on a light entering side and a refractive index of the plate are set in such a manner that a light ray whose optical path has been converted by the prism array disposed on the light entering side is totally reflected on a side surface of the plate, and an image display panel.

15. An image display apparatus according to claim 14, further comprising a projecting optical system for image on the image display panel a screen.

* * * * *